(12) United States Patent
Nakamura et al.

(10) Patent No.: US 9,349,714 B2
(45) Date of Patent: May 24, 2016

(54) METHOD OF MANUFACTURING SEMICONDUCTOR DEVICE, BLOCK STACKED BODY, AND SEQUENTIAL STACKED BODY

(75) Inventors: Kensuke Nakamura, Tokyo (JP); Toru Meura, Tokyo (JP); Yoji Ishimura, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 270 days.

(21) Appl. No.: 14/239,960

(22) PCT Filed: Aug. 24, 2012

(86) PCT No.: PCT/JP2012/071469
§ 371 (c)(1),
(2), (4) Date: Feb. 20, 2014

(87) PCT Pub. No.: WO2013/027832
PCT Pub. Date: Feb. 28, 2013

(65) Prior Publication Data
US 2014/0183758 A1 Jul. 3, 2014

(30) Foreign Application Priority Data

Aug. 24, 2011 (JP) ................................. 2011-182424
Sep. 1, 2011 (JP) ................................. 2011-190280

(51) Int. Cl.
*H01L 25/00* (2006.01)
*H01L 23/00* (2006.01)
(Continued)

(52) U.S. Cl.
CPC ................ *H01L 25/50* (2013.01); *H01L 24/75* (2013.01); *H01L 24/92* (2013.01); *H01L 24/94* (2013.01);
(Continued)

(58) Field of Classification Search
CPC ............ H01L 2224/97; H01L 2224/81; H01L 2224/73204; H01L 2224/16145; H01L 2224/32145; H01L 2924/00; H01L 2224/05655; H01L 2924/00014; H01L 2224/13111; H01L 2924/014; H01L 2224/13139
See application file for complete search history.

(56) References Cited

U.S. PATENT DOCUMENTS 6,774,478 B2 * 8/2004 Eto ...................... H01L 25/0657
257/686
7,276,799 B2 * 10/2007 Lee ................... H01L 21/76898
257/774
(Continued)

FOREIGN PATENT DOCUMENTS

CN 1162901 C 8/2004
CN 101669197 A 3/2010
(Continued)

OTHER PUBLICATIONS

Office Action issued Dec. 17, 2015, in Chinese Patent Application No. 201280040614.1, filed Aug. 24, 2012.

*Primary Examiner* — Roy Potter
(74) *Attorney, Agent, or Firm* — Oblon, McClelland, Maier & Neustadt, L.L.P.

(57) ABSTRACT

A method of manufacturing a semiconductor device is provided which is capable of improving productivity and reliability. The method of manufacturing a semiconductor device (1) of the invention includes a sequential stacking process, an individual stacked body-obtaining process, and a base material bonding process. In the sequential stacking process, a block stacked body is obtained. The block stacked body is a block stacked body (2B) in which semiconductor blocks (10B, 12B, 14B, and 16B) are stacked in a state of not being solder-bonded. In the semiconductor blocks (10B, 12B, 14B, and 16B), a plurality of semiconductor components are arranged. In the individual stacked body obtaining process, an individual stacked body (2) is obtained in which terminals of the stacked semiconductor components are solder-bonded and which is cut from the block stacked body (2B) in a stacked semiconductor component unit.

23 Claims, 9 Drawing Sheets

(51) Int. Cl.
*H01L 25/065* (2006.01)
*H01L 23/31* (2006.01)

(52) U.S. Cl.
CPC ............ *H01L 24/97* (2013.01); *H01L 25/0657* (2013.01); *H01L 23/3121* (2013.01); *H01L 24/13* (2013.01); *H01L 24/16* (2013.01); *H01L 24/29* (2013.01); *H01L 24/32* (2013.01); *H01L 24/81* (2013.01); *H01L 24/83* (2013.01); *H01L 2224/0401* (2013.01); *H01L 2224/05025* (2013.01); *H01L 2224/05568* (2013.01); *H01L 2224/05655* (2013.01); *H01L 2224/06181* (2013.01); *H01L 2224/13007* (2013.01); *H01L 2224/13023* (2013.01); *H01L 2224/13109* (2013.01); *H01L 2224/13111* (2013.01); *H01L 2224/13113* (2013.01); *H01L 2224/13116* (2013.01); *H01L 2224/13118* (2013.01); *H01L 2224/13139* (2013.01); *H01L 2224/13147* (2013.01); *H01L 2224/16145* (2013.01); *H01L 2224/16146* (2013.01); *H01L 2224/16238* (2013.01); *H01L 2224/2919* (2013.01); *H01L 2224/32145* (2013.01); *H01L 2224/73104* (2013.01); *H01L 2224/73204* (2013.01); *H01L 2224/7598* (2013.01); *H01L 2224/75251* (2013.01); *H01L 2224/75252* (2013.01); *H01L 2224/81191* (2013.01); *H01L 2224/81203* (2013.01); *H01L 2224/81209* (2013.01); *H01L 2224/81815* (2013.01); *H01L 2224/83191* (2013.01); *H01L 2224/83193* (2013.01); *H01L 2224/83203* (2013.01); *H01L 2224/83209* (2013.01); *H01L 2224/83862* (2013.01); *H01L 2224/9211* (2013.01); *H01L 2224/94* (2013.01); *H01L 2224/97* (2013.01); *H01L 2225/06513* (2013.01); *H01L 2225/06517* (2013.01); *H01L 2225/06541* (2013.01); *H01L 2225/06565* (2013.01); *H01L 2924/00014* (2013.01); *H01L 2924/01029* (2013.01); *H01L 2924/10253* (2013.01); *H01L 2924/12042* (2013.01); *H01L 2924/15787* (2013.01); *H01L 2924/181* (2013.01)

(56) References Cited

U.S. PATENT DOCUMENTS

| | | | |
|---|---|---|---|
| 7,608,921 B2 * | 10/2009 | Pendse | H01L 21/563 257/686 |
| 8,294,281 B2 * | 10/2012 | Yoshida | H01L 21/561 257/777 |
| 2005/0230804 A1 | 10/2005 | Tanida et al. | |
| 2006/0284298 A1 * | 12/2006 | Kim | H01L 25/0657 257/686 |
| 2007/0080457 A1 | 4/2007 | Tanida et al. | |
| 2007/0278644 A1 * | 12/2007 | Hsu | H01L 23/5389 257/686 |
| 2008/0265430 A1 | 10/2008 | Ishihara | |
| 2010/0129960 A1 | 5/2010 | Mejima et al. | |
| 2013/0026643 A1 * | 1/2013 | England | H01L 21/561 257/774 |

FOREIGN PATENT DOCUMENTS

| | | |
|---|---|---|
| JP | 2003-12773 | 1/2003 |
| JP | 2003-277585 | 10/2003 |
| JP | 2004-088060 A | 3/2004 |
| JP | 2004-311709 A | 11/2004 |
| JP | 2005-136187 | 5/2005 |
| JP | 2005-175263 | 6/2005 |
| JP | 2005-277059 | 10/2005 |
| JP | 2008-13710 | 1/2008 |
| JP | 2008-300443 A | 12/2008 |
| JP | 2009-110995 | 5/2009 |
| JP | 2010-278334 | 12/2010 |
| JP | 2011-29392 | 2/2011 |
| TW | 201027640 A1 | 7/2010 |
| WO | WO 2008/136352 A1 | 11/2008 |

* cited by examiner (A)

(B)

(C)

(A)

(B)

(C)

METHOD OF MANUFACTURING SEMICONDUCTOR DEVICE, BLOCK STACKED BODY, AND SEQUENTIAL STACKED BODY

TECHNICAL FIELD

The present invention relates to a method of manufacturing a semiconductor device, a block stacked body, and a sequential stacked body.

Priority is claimed on Japanese Patent Application No. 2011-182424, filed Aug. 24, 2011, and Japanese Patent Application No. 2011-190280, filed Sep. 1, 2011, the contents of which are incorporated herein by reference.

BACKGROUND ART

In the related art, a semiconductor device configured by stacking a plurality of semiconductor elements is used. For example, PTL 1 and PTL 2 disclose a semiconductor device in which a plurality of semiconductor elements (or semiconductor substrates) having a through silicon via (TSV) are stacked. FIG. 11 shows a semiconductor device 900 disclosed in PTL 1. The semiconductor device 900 has a structure in which a semiconductor chip 903 is stacked on an interposer 901 through a resin layer 902.

The semiconductor device 900 is manufactured as follows. As shown in FIG. 12 (A), a connection bump 900A is formed on the interposer 901 in advance. Then, as shown in FIG. 12 (B), a film-shaped adhesive (resin layer) 902 is provided. Then, as shown in FIG. 12 (C), the semiconductor chip 903 is stacked, and solder bonding is carried out.

When these processes are repeated, the semiconductor device 900 shown in FIG. 11 is obtained.

PTL 2 discloses the following manufacturing method. After four semiconductor substrates are stacked, opposing semiconductor substrates are solder-bonded to each other. Then, the semiconductor substrates are encapsulated with a resin, and a resin is injected between the semiconductor substrates.

CITATION LIST

Patent Literature

[PTL 1] Japanese Unexamined Patent Application, First Publication No. 2011-29392
[PTL 2] Japanese Unexamined Patent Application, First Publication No. 2010-278334

SUMMARY OF INVENTION

Technical Problem

However, in the method of manufacturing a semiconductor device according to PTL 1, solder-bonding is repeated each timer the semiconductor chip is stacked, and thus there is a problem relating to productivity during solder-bonding. Further, each time the semiconductor chip is stacked, solder-bonding is repeated, and heating during solder-bonding to a lower layer semiconductor chip may be of concern.

On the other hand, in the method of manufacturing a semiconductor device according to PTL 2, after the semiconductor substrates are bonded to each other, the resin is filled in a gap between the semiconductor substrates, and thus it is difficult to fill the gap with the resin, and productivity becomes problematic.

Solution to Problem

According to a first aspect of the invention, a method of manufacturing a semiconductor device is provided. The method includes a process of preparing a first semiconductor block in which a plurality of first semiconductor components are arranged and which includes a second semiconductor component connection terminal, a first resin layer, a second semiconductor block in which a plurality of second semiconductor components are arranged and which includes a first semiconductor component connection terminal on one surface side and a third semiconductor component connection terminal on the other surface side, a second resin layer, and a third semiconductor block in which a plurality of third semiconductor components are arranged and which includes a second semiconductor component connection terminal, a sequential stacking process of sequentially stacking the first semiconductor block, the first resin layer, the second semiconductor block, the second resin layer, and the third semiconductor block, and bonding the layers to obtain a block stacked body, and a process of obtaining an individual stacked body, in which the second semiconductor component connection terminal of the first semiconductor component and the first semiconductor component connection terminal of the second semiconductor component are solder-bonded to each other and the third semiconductor component connection terminal of the second semiconductor component and the second semiconductor component connection terminal of the third semiconductor component are solder-bonded, and which is cut in a stacked semiconductor component unit, from the block stacked body.

In the method of manufacturing a semiconductor device, the block stacked body may be obtained by the sequential stacking process which includes a process of stacking the first resin layer and the second semiconductor block on the first semiconductor block in this order, and heating the resultant stacked body to bond the first semiconductor block and the second semiconductor block through the first resin layer in a semi-cured state; and a process of stacking the second resin layer and the third semiconductor block on the second semiconductor block in this order, and heating the resultant stacked body to bond the second semiconductor block and the third semiconductor block through the second resin layer in a semi-cured state.

The method of manufacturing a semiconductor device may further include a process of providing the individual stacked body, which is solder-bonded, on a base material, and a base material bonding process of bonding the individual stacked body and the base material.

In the method of manufacturing a semiconductor device, at a preceding stage of the sequential stacking process, a resin layer that constitutes the first resin layer may be provided on at least any one of the surface of the second semiconductor block on which the first semiconductor component connection terminal is formed and the surface of the first semiconductor block on which the second semiconductor component connection terminal is provided, and a resin layer that constitutes the second resin layer may be provided on at least any one of the surface of the third semiconductor block on which the second semiconductor component connection terminal is formed and the surface of the second semiconductor block on which the third semiconductor component connection terminal is provided.

In the method of manufacturing a semiconductor device, the block stacked body may be configured in such a manner that at least any one of the second semiconductor component connection terminal of the first semiconductor component and the first semiconductor component connection terminal of the second semiconductor component includes a solder layer, and at least any one of the third semiconductor component connection terminal of the second semiconductor component and the second semiconductor component connection terminal of the third semiconductor component includes a solder layer. The process of obtaining the individual stacked body may include a first bonding process (a block stacked body bonding process) of heating the block stacked body to a temperature equal to or higher than a melting point of the solder layer to solder-bond the second semiconductor component connection terminal of the first semiconductor component and the first semiconductor component connection terminal of the second semiconductor component and the third semiconductor component connection terminal of the second semiconductor component and the second semiconductor component connection terminal of the third semiconductor component, respectively, and a cutting process of cutting the block stacked body in a stacked semiconductor component unit after the first bonding process (the block stacked body bonding process) to obtain the individual stacked body.

In the method of manufacturing a semiconductor device, the first resin layer and the second resin layer may each contain a thermosetting resin. In the block stacked body bonding process, the block stacked body, in which the first semiconductor block and the second semiconductor block are bonded to each other through the first resin layer and the second semiconductor block and the third semiconductor block are bonded to each other through the second resin layer, may be heated to carry out solder-bonding and promote curing of the first resin layer and the second resin layer.

In the method of manufacturing a semiconductor device, in the block stacked body bonding process, the block stacked body may be provided on the upper side of one press member of a pair of press members, and the block stacked body may be compressed between the one press member and the other press member and may be heated to carry out solder-bonding and to promote curing of the first resin layer and the second resin layer.

In the method of manufacturing a semiconductor device, in the block stacked body bonding process, the block stacked body may be heated while being compressed with a fluid to carry out solder-bonding.

In the method of manufacturing a semiconductor device, an apparatus, which includes the pair of press members disposed to face each other, and a setting portion which is disposed between the pair of press members and on which the block stacked body is provided, may be prepared, and the block stacked body bonding process may include a process of heating the pair of press members and disposing the block stacked body on the setting portion that is spaced away from the pair of press members, and a process of compressing and heating the block stacked body and the setting portion with the pair of press members to carry out solder-bonding.

In the method of manufacturing a semiconductor device, a temperature of the one press member may be lower than a temperature of the other press member.

In the method of manufacturing a semiconductor device, the first resin layer and the second resin layer may each contain a thermosetting resin, and between the block stacked body bonding process and the base material bonding process, the block stacked body may be heated while being compressed with a fluid to promote curing of the first resin layer and the second resin layer.

In the method of manufacturing a semiconductor device, the block stacked body may be configured in such a manner that at least any one of the second semiconductor component connection terminal of the first semiconductor component and the first semiconductor component connection terminal of the second semiconductor component includes a solder layer, and at least any one of the third semiconductor component connection terminal of the second semiconductor component and the second semiconductor component connection terminal of the third semiconductor component includes a solder layer. The process of obtaining the individual stacked body may include a cutting process of cutting the block stacked body in a stacked semiconductor component unit to obtain a sequential stacked body, and a first bonding process (a sequential stacked body bonding process) of heating the sequential stacked body to a temperature equal to or higher than a melting point of the solder layer, and solder-bonding the second semiconductor component connection terminal of the first semiconductor component and the first semiconductor component connection terminal of the second semiconductor component and solder-bonding the third semiconductor component connection terminal of the second semiconductor component and the second semiconductor component connection terminal of the third semiconductor component, respectively, to obtain an individual stacked body.

Here, solder-bonding between the connection terminals in the first bonding process (the block stacked body bonding process or the sequential stacked body bonding process) represents the following state. That is, the stacked body is heated to a temperature equal to or higher than the melting point of the solder layer, and thus each solder layer that is used for bonding between the semiconductor components is melted, the semiconductor component connection terminals come into physical contact with each other, and an alloy is formed on at least a part of a contact portion.

In the method of manufacturing a semiconductor device, the first resin layer and the second resin layer may each contain a thermosetting resin, and in the sequential stacked body bonding process, the sequential stacked body, in which the first semiconductor component and the second semiconductor component are bonded to each other through the first resin layer, and the second semiconductor component and the third semiconductor component are bonded to each other through the second resin layer, may be heated to carry out solder-bonding and promote curing of the first resin layer and the second resin layer.

In the method of manufacturing a semiconductor device, in the sequential bonding process, the sequential stacked body may be disposed on the upper side of one press member of a pair of press members, and the sequential stacked body may be compressed between the one press member and the other press member and may be heated to carry out solder-bonding and to promote curing of the first resin layer and the second resin layer.

In the method of manufacturing a semiconductor device, in the sequential stacked body bonding process, the sequential stacked body may be heated while being compressed with a fluid to carry out solder-bonding.

In the method of manufacturing a semiconductor device, an apparatus, which includes the pair of press members disposed to face each other, and a setting portion which is disposed between the pair of press members and on which the sequential stacked body is provided, may be prepared, and the sequential stacked body bonding process may include a process of heating the pair of press members and disposing the sequential stacked body on the setting portion that is spaced away from the pair of press members, and a process of compressing and heating the sequential stacked body and the setting portion with the pair of press members to carry out solder-bonding.

In the method of manufacturing a semiconductor device, a temperature of the one press member may be lower than a temperature of the other press member.

In the method of manufacturing a semiconductor device, the first resin layer and the second resin layer may each contain a thermosetting resin, and between the sequential stacked body bonding process and the base material bonding process, the sequential stacked body may be heated while being compressed with a fluid to promote curing of the first resin layer and the second resin layer.

In the method of manufacturing a semiconductor device, the individual stacked body may have a structure which includes at least the first semiconductor component, the first resin layer, the second semiconductor component, the second resin layer, and the third semiconductor component, in which each of the resin layers and each of the semiconductor components are alternately stacked, and in which the outermost layer is constituted by the semiconductor component. The semiconductor component of the outermost layer may include a base material connection terminal that is connected to the base material, the base material includes a stacked body connection terminal that is connected to the semiconductor component of the outermost layer, and at least any one of the base material connection terminal and the stacked body connection terminal includes a solder layer, and in the base material bonding process, the base material connection terminal and the stacked body connection terminal may be solder-bonded.

In the method of manufacturing a semiconductor device, in the base material bonding process, a plurality of the individual stacked bodies may be solder-bonded to the base material, and the base material may be cut for each of the individual stacked bodies at a subsequent stage of the base material bonding process.

In the method of manufacturing a semiconductor device, the second semiconductor component may be a semiconductor chip with a TSV structure including a substrate and a through-via which penetrates through the substrate and is connected to the first semiconductor component connection terminal and the third semiconductor component connection terminal, and the third semiconductor component may be a semiconductor chip with a TSV structure which includes a substrate and a through-via that penetrates through the substrate, the through-via being connected to the second semiconductor component connection terminal and a terminal provided on the surface side, which is opposite to the surface side of the substrate on which the second semiconductor component connection terminal is provided.

In addition, according to a second aspect of the invention, a block stacked body is provided. The block stacked body includes a first semiconductor block in which a plurality of first semiconductor components are arranged and which includes a second semiconductor component connection terminal, a first resin layer, a second semiconductor block in which a plurality of second semiconductor components are arranged and which includes a first semiconductor component connection terminal on one surface side and a third semiconductor component connection terminal on the other surface side, a second resin layer, and a third semiconductor block in which a plurality of third semiconductor components are arranged and which includes a second semiconductor component connection terminal. At least any one of the second semiconductor component connection terminal of the first semiconductor component and the first semiconductor component connection terminal of the second semiconductor component includes a solder layer, and at least any one of the third semiconductor component connection terminal of the second semiconductor component and the second semiconductor component connection terminal of the third semiconductor component includes a solder layer. The second semiconductor component connection terminal of the first semiconductor component and the first semiconductor component connection terminal of the second semiconductor component are solder-bonded to each other, and the third semiconductor component connection terminal of the second semiconductor component and the second semiconductor component connection terminal of the third semiconductor component are solder-bonded to each other.

In addition, according to a third aspect of the invention, a sequential stacked body is provided, wherein a first semiconductor component including a second semiconductor component connection terminal, a first resin layer, a second semiconductor component including a first semiconductor component connection terminal on one surface side and a third semiconductor component connection terminal on the other surface side, a second resin layer, and a third semiconductor component including a second semiconductor component connection terminal are stacked. At least any one of the second semiconductor component connection terminal of the first semiconductor component and the first semiconductor component connection terminal of the second semiconductor component includes a solder layer, and at least any one of the third semiconductor component connection terminal of the second semiconductor component and the second semiconductor component connection terminal of the third semiconductor component includes a solder layer. The second semiconductor component connection terminal of the first semiconductor component and the first semiconductor component connection terminal of the second semiconductor component are not yet solder-bonded, and the third semiconductor component connection terminal of the second semiconductor component and the second semiconductor component connection terminal of the third semiconductor component are not yet solder-bonded.

According to the method of manufacturing a semiconductor device of the first aspect of the invention, after constituting the block stacked body in which the first semiconductor block, the first resin layer, the second semiconductor block, the second resin layer, and the third semiconductor block are stacked, an individual stacked body in which the respective connection terminals are solder-bonded and which is cut in a semiconductor component unit is obtained using the block stacked body. Solder-bonding between the respective connection terminals can be carried out by heating the block stacked body. Accordingly, it is possible to further improve productivity compared to a case in which stacking is carried out in a semiconductor chip unit that is divided into an individual piece from a single semiconductor block. In addition, it is possible to further improve productivity during solder-bonding compared to a case in which solder-bonding is sequentially carried out every semiconductor components facing to each other.

In addition, after constituting the block stacked body in which the first semiconductor block, the first resin layer, the second semiconductor block, the second resin layer, and the third semiconductor block are stacked, solder-bonding can be carried out by heating the entirety of the block stacked body. Accordingly, it is possible to further reduce thermal damage that is applied to the each semiconductor component as in comparison to the related art. As a result, reliability of the semiconductor device can be improved.

Further, in the manufacturing method of the invention, after constituting the block stacked body in which the first semiconductor block, the first resin layer, the second semiconductor block, the second resin layer, and the third semiconductor block are stacked, solder-bonding the respective terminals can be carried out by heating the block stacked body. Since the resin layer is interposed between the semiconductor components before solder-bonding, it needs less time and effort compared to a case in which a resin is filled between the semiconductor components after solder-bonding.

Furthermore, in the manufacturing method of the invention, since the resin layer is interposed between the semiconductor components in the block stacked body, warpage is not likely to occur, and an misalignment is not likely to occur during solder-bonding between the respective semiconductor components in the block stacked body. Accordingly, in the manufacturing method of the invention, a positional misalignment between the semiconductor components can be prevented, and thus an individual stacked body in which positional alignment is accurately carried out can be mounted on the base material.

In addition, according to the manufacturing method of the invention, after constituting the block stacked body in which the first semiconductor component, the first resin layer, the second semiconductor component, the second resin layer, and the third semiconductor component are stacked, solder-bonding between the respective connection terminals can be carried out by heating the entirety of a sequential stacked body that is obtained by cutting the block stacked body. Accordingly, it is possible to further improve productivity during solder-bonding compared to a case in which solder-bonding is sequentially carried out every semiconductor components facing to each other.

In addition, since solder-bonding is carried out by heating the entirety of the sequential stacked body in which the first semiconductor component, the first resin layer, the second semiconductor component, the second resin layer, and the third semiconductor component are stacked. Accordingly, it is possible to further reduce thermal damage that is applied to the each semiconductor component as in comparison to the related art. As a result, reliability of the semiconductor device can be improved.

Furthermore, in the manufacturing method of the invention, solder-bonding between the each terminals is carried out by heating the sequential stacked body in which the first semiconductor component, the first resin layer, the second semiconductor component, the second resin layer, and the third semiconductor component are stacked. Since the resin layer is interposed between the semiconductor components before solder-bonding, it needs less time and effort compared to a case in which a resin is filled between the semiconductor components after solder-bonding.

Further, in the manufacturing method of the invention, since the resin layer is interposed between the semiconductor components in the block stacked body, warpage is not likely to occur, and an misalignment is not likely to occur during solder-bonding between the respective semiconductor components in the sequential stacked body. Accordingly, in the invention, a positional misalignment between the semiconductor components can be prevented, and thus an individual stacked body in which positional alignment is accurately carried out can be mounted on the base material.

In the second aspect of the invention, the block stacked body, in which the first semiconductor block, the first resin layer, the second semiconductor block, the second resin layer, and the third semiconductor block are stacked, and the semiconductor component connection terminal is solder-bonded between the semiconductor blocks that are stacked, is provided. When an individual stacked body is manufactured using the block stacked body, it is possible to improve productivity during solder-bonding and reliability of the semiconductor device.

In the third aspect of the invention, the sequential stacked body, in which the first semiconductor component, the first resin layer, the second semiconductor component, the second resin layer, and the third semiconductor component are stacked, and the semiconductor component connection terminals are not yet solder-bonded between the semiconductor components that are stacked, is provided. When an individual stacked body is manufactured using the sequential stacked body, it is possible to improve productivity during solder-bonding and reliability of the semiconductor device.

Advantageous Effects of Invention

According to the invention, a method of manufacturing a semiconductor device, a block stacked body, and a sequential stacked body, which are capable of improving productivity and reliability, are provided.

DESCRIPTION OF EMBODIMENTS

Figure 1:
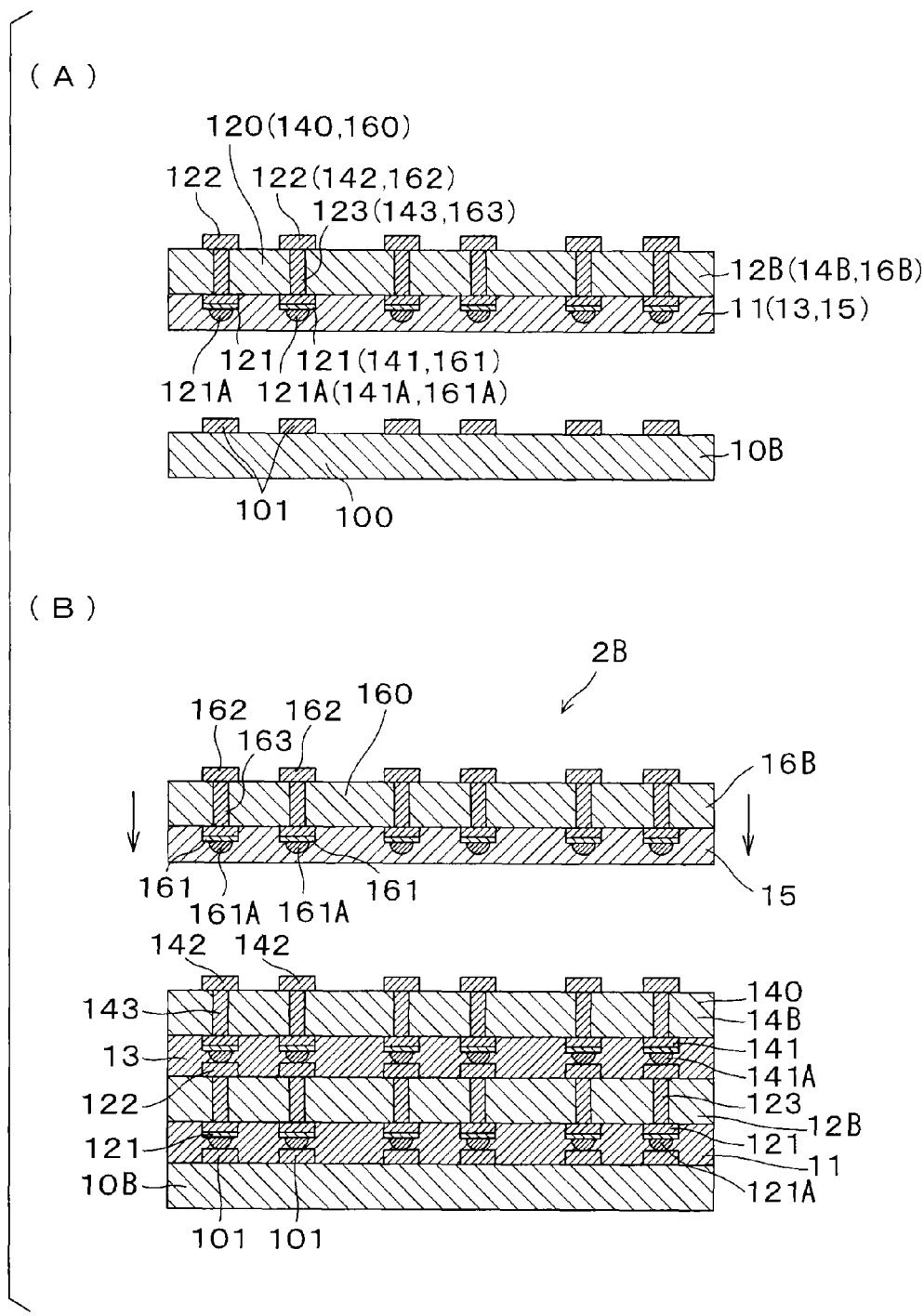
FIG. 1 is a cross-sectional diagram illustrating a process of manufacturing a semiconductor device according to a first embodiment.
Figure 2:
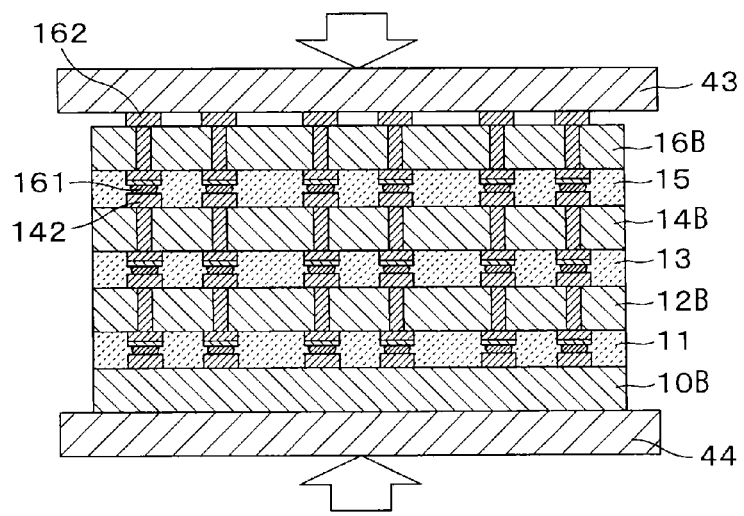
FIG. 2 is a cross-sectional diagram illustrating the process of manufacturing the semiconductor device according to the first embodiment.
Figure 2:
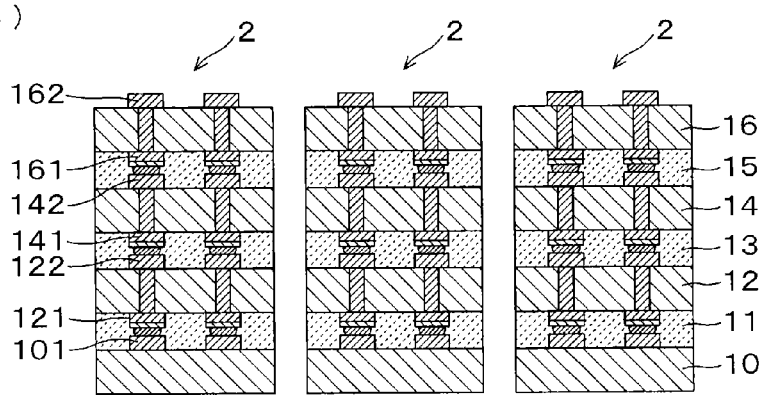
Figure 2:
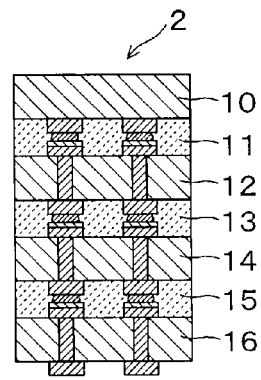

Hereinafter, embodiments of the invention will be described with reference to the attached drawings.

First Embodiment

FIGS. 1 to 5 show a method of manufacturing a semiconductor device of the embodiment.

First, the outline of the method of manufacturing the semiconductor device 1 of the embodiment will be described.

The method of manufacturing the semiconductor device 1 of the embodiment includes a sequential stacking process, a first bonding process (block stacked body bonding process), a cutting process, and a second bonding process (base material bonding process).

In the sequential stacking process, a first semiconductor block 10B in which semiconductor chips (first semiconductor components) 10 are arranged, a resin layer (first resin layer) 11, a second semiconductor block 12B in which semiconductor chips (second semiconductor components) 12 are arranged, a resin layer (second resin layer) 13, a third semiconductor block 14B in which semiconductor chips (third semiconductor components) 14 are arranged, a resin layer (third resin layer) 15, and a fourth semiconductor block 16B in which semiconductor chips (fourth semiconductor components) 16 are arranged are bonded to obtain a block stacked body 2B.

In the first bonding process (block stacked body bonding process), the block stacked body 2B, which is obtained by stacking the first semiconductor block 10B, the first resin layer 11, the second semiconductor block 12B, the second resin layer 13, the third semiconductor block 14B, the third resin layer 15, and the fourth semiconductor block 16B, and in which the semiconductor blocks 10B and 12B are not solder-bonded to each other, the semiconductor blocks 12B and 14B are not solder-bonded to each other, and the semiconductor blocks 14B and 16B are not solder-bonded to each other, is heated to carry out solder-bonding of the semiconductor blocks 10B and 12B, the solder-bonding of the semiconductor blocks 12B and 14B, and the solder-bonding of the semiconductor blocks 14B and 16B.

In the cutting process, the block stacked body 2B is cut to form an individual stacked body 2 as a stacked semiconductor component unit.

Here, each of the semiconductor blocks in which a plurality of semiconductor components are arranged may have any shape such as a wafer size shape, a block shape in which a plurality of semiconductor components are arranged and which is processed in a rectangular shape, and a shape in which a plurality of semiconductor components are arranged and in which the semiconductor components are not arranged in a peripheral portion. In addition, a configuration of stacking the semiconductor blocks may employ a case in which stacking is carried out in a wafer size, and a case in which block size stacking is carried out in a wafer size.

In addition, the semiconductor components that are arranged in each of the semiconductor blocks are not limited to the semiconductor chips, and may be a silicon interposer or a glass interposer.

Then, the individual stacked body 2 that is solder-bonded is provided on a base material 18. The individual stacked body 2 is provided on the base material 18 in such a manner that a connection terminal 162 of the individual stacked body 2 which is to be connected to the base material 18 and a connection terminal 181 of the base material 18 which is to be connected to the individual stacked body 2 come into contact with each other.

Next, in the second bonding process (base material bonding process), the individual stacked body 2 and the base material 18 are heated to a temperature equal to or higher than a melting point of a solder layer 181A of the connection terminal 181 to solder-bond the individual stacked body 2 to the base material 18.

Next, a method of manufacturing the semiconductor device 1 according to the embodiment will be described in detail.

First, as shown in FIG. 1(A), the semiconductor block 10B is prepared. In the semiconductor block 10B, the semiconductor chips (first semiconductor components) 10 are arranged on a substrate surface, and terminals (terminals for connection to the semiconductor chips 12) 101 of the semiconductor chips 10 are provided on the substrate surface. In the embodiment, a via that penetrates through the substrate is not provided. Each of the connection terminals 101 has, for example, a structure in which a copper layer, a nickel layer, and a gold layer are stacked in this order from a substrate side. However, the structure of the connection terminal 101 is not limited thereto.

Here, the thickness of the semiconductor block 10B is 10 μm to 150 μm, and more preferably 20 μm to 100 μm.

In addition, the terminals are not provided on a rear surface side that is the other substrate surface of the semiconductor block 10B.

In addition, as shown in FIG. 1(A), the semiconductor block 12B is prepared. The semiconductor block 12B is a semiconductor element with a TSV structure including a substrate (silicon substrate) 120 and a via 123 that penetrates through the substrate 120. A terminal 121 is provided on one surface of the substrate 120, and a terminal 122 is provided on the other surface of the substrate 120. The terminals 121 and 122 are connected to each other with the via 123. The terminal 121 is a connection terminal that is connected to the semiconductor block 10B, and the terminal 122 is a connection terminal that is connected to the semiconductor block 14B.

For example, the via 123 is constituted by metal such as copper and tungsten, or conductive polysilicon doped with an impurity.

For example, the terminal 122 is configured by the same layer configuration as the terminal 101.

The terminal 121 includes a solder layer 121A on the surface thereof. For example, the connection terminal 121 has a structure in which a nickel layer is stacked on a copper layer, and the solder layer 121A is provided to cover the nickel layer.

A material of the solder layer 121A is not particularly limited, and examples of the material include alloys that contain at least one kind selected from the group consisting of tin, silver, lead, zinc, bismuth, indium, and copper. Among these alloys, an alloy, which contains at least one kind selected from the group consisting of tin, silver, lead, zinc, and copper, is preferable. A melting point of the solder layer 121A is 110° C. to 250° C., and preferably 170° C. to 230° C.

The resin layer 11 is provided on the surface of the semiconductor block 12B on a side in which the terminal 121 of the substrate 120 is provided.

The resin layer 11 covers the terminal 121. Although details of the resin layer 11 are described later, the resin layer 11 is a layer that contains a thermosetting resin and a flux active compound.

Further, the semiconductor block 14B and the semiconductor block 16B are also prepared (refer to FIGS. 1(A) and (B)).

Here, the semiconductor blocks 14B and 16B are similar to the semiconductor block 12B. That is, similar to the semiconductor block 12B, the semiconductor blocks 14B and 16B are semiconductor elements with the TSV structure. The semiconductor block 14B includes a substrate (silicon substrate) 140, a via 143 that penetrates through the substrate 140, and a pair of terminals 142 and 141 which is connected to the via 143. The terminal 142 is a connection terminal that is connected to the semiconductor block 16B, and the terminal 141 is a connection terminal that is connected to the semiconductor block 12B. The semiconductor block 16B includes a substrate (silicon substrate) 160, a via 163 that penetrates through the substrate 160, and a pair of terminals 162 and 161 which is connected to the via 163. The terminal 162 is a connection terminal that is connected to the base material 18, and the terminal 161 is a connection terminal that is connected to the semiconductor block 14B.

The vias 143 and 163 are constituted by the same material as the via 123. The terminals 142 and 162 have the same configuration as the terminal 122 and are constituted by the same material as the terminal 122. The terminals 141 and 161 have the same configuration as the terminal 121 and are constituted by the same material as the terminal 121. In addition, reference numerals 141A and 161A represent the same solder layer as the solder layer 121A.

The resin layer 13 that covers the terminal 141 is provided to the semiconductor block 14B. In addition, the resin layer 15 that covers the terminal 161 is provided to the semiconductor block 16B.

Here, as a method of providing the resin layers 11, 13, and 15 to the semiconductor blocks 12B, 14B, and 16B, respectively, for example, the following method may be exemplified.

Resin sheets of the resin layers 11, 13, and 15 are attached to the semiconductor blocks 12B, 14B, and 16B, respectively.

In addition, resin layers which are obtained by integrating the resin layers 11, 13, and 15 with the semiconductor blocks 12B, 14B, and 16B, respectively, by spin coating may be formed to prepare the semiconductor block 12B to which the resin layer 11 is attached, the semiconductor block 14B to which the resin layer 13 is attached, and the semiconductor block 16B to which the resin layer 15 is attached.

In addition, in the embodiment, the semiconductor blocks 10B, 12B, 14B, and 16B have the same size in plan view (plan view seen from a substrate surface side). In addition, the thickness of substrates 100, 120, 140, and 160 of the semiconductor blocks 10B, 12B, 14B, and 16B is 10 μm to 150 μm, and more preferably 20 μm to 100 μm. In addition, the thickness may be set to as small as 50 μm or less to be very thin.

(Sequential Stacking Process: Process of Preparing Block Stacked Body)

Next, as shown in FIG. 1(B), the block stacked body 2B that is constituted by the semiconductor block 10B, the resin layer 11, the semiconductor block 12B, the resin layer 13, the semiconductor block 14B, the resin layer 15, and the semiconductor block 16B is prepared.

In the embodiment, first, the surface of the semiconductor block 10B on which the terminal 101 is formed and the resin layer 11 provided to the semiconductor block 12B are made to face each other, and the semiconductor block 12B is stacked on the semiconductor block 10B through the resin layer 11.

At this time, an alignment mark formed on the semiconductor block 10B and an alignment mark formed on the semiconductor block 12B are confirmed to carry out positional alignment.

Then, the semiconductor block 10B, the resin layer 11, and the semiconductor block 12B are heated to bond the semiconductor block 10B and the semiconductor block 12B to each other through the resin layer 11 which is in a semi-cured state (B stage). At this time, the semiconductor block 10B, the resin layer 11, and the semiconductor block 12B are heated by being interposed between the pair of heater-embedded press members, and are compressed by the pair of press members to apply a load thereto, whereby the semiconductor block 10B and the semiconductor block 12B can be bonded to each other. For example, the semiconductor block 10B and the semiconductor block 12B are bonded to each other through the resin layer 11 by using a wafer bonder, a flip chip bonder, and the like in the air under an atmospheric pressure or in the air under a vacuum pressure. A heating temperature is not particularly limited as long as the thermosetting resin of the resin layer 11 is not completely cured, but it is preferable that the heating temperature be lower than a curing temperature of the thermosetting resin.

In addition, bonding in a case of bonding the solder blocks to each other may be bonding in which two semiconductor blocks are fixed to each other by a resin layer to a certain degree at which positional misalignment does not occur, and the bonding represents a concept including the following semi-cured state (B stage).

In addition, "the resin layer is in the semi-cured state (B stage)" represents a state of having hardness to a certain degree at which the upper and lower semiconductor blocks of the resin layer may be fixed to each other, and represents a state in which there is room for further curing reaction. The semi-cured state is not particularly limited, but may be confirmed, for example, by measuring a reaction rate of the resin layer. The semi-cured state represents a state in which the reaction rate in DSC measurement is preferably 0% to 60%, more preferably 0.5% to 55%, and still more preferably 1% to 50%. In addition, when a reaction calorie of an uncured resin film and a reaction calorie of a semi-cured film, which are measured under a condition in which a temperature rising rate is 10° C./min, are set as A and B, respectively, the reaction rate may be expressed by the following expression.

$$\text{Reaction rate (\%)} = (1 - B/A) \times 100$$

When the resin layer is set to the semi-cured state, it is preferable from the following viewpoints. Enough hardness of the resin can be obtained to prevent the misalignment of the semiconductor blocks due to the resin layer. Enough followability of the resin layer can be secured in the solder-bonding process to carry out the solder-bonding reliably. Hardenability of a flux component remains to be capable of exhibiting flux function and exhibit sufficient flux function, and thus reaction may be suppressed to a certain degree.

Whether or not the position of the semiconductor block 12B after the bonding with respect to the semiconductor block 10B is accurate may be confirmed, for example, by using an X-ray microscope or an infrared microscope.

Next, the surface of the semiconductor block 12B on which the terminal 122 is provided and the resin layer 13 are made to face each other, and the semiconductor block 14B is stacked on the semiconductor block 12B through the resin layer 13.

At this time, an alignment mark formed on the semiconductor block 12B and an alignment mark formed on the semiconductor block 14B are confirmed to carry out positional alignment.

Then, the semiconductor block 10B, the resin layer 11, the semiconductor block 12B, the resin layer 13, and the semiconductor block 14B are heated to bond the semiconductor block 12B and the semiconductor block 14B to each other through the resin layer 13 in a semi-cured state (B stage). At this time, the semiconductor block 10B, the resin layer 11, the semiconductor block 12B, the resin layer 13, and the semiconductor block 14B are heated by being interposed between the pair of heater-embedded press members, and are compressed by the pair of press members to apply a load thereto, whereby the semiconductor block 12B and the semiconductor block 14B can be bonded to each other. For example, the semiconductor block 12B and the semiconductor block 14B are bonded to each other by using a wafer bonder, a flip chip bonder, and the like in the air under an atmospheric pressure or in the air under a vacuum pressure. A heating temperature is not particularly limited as long as the thermosetting resin of the resin layer 13 is not completely cured, but it is preferable that the heating temperature be lower than a curing temperature of the thermosetting resin.

Whether or not the position of the semiconductor block 14B after the bonding with respect to the semiconductor block 12B is accurate may be confirmed, for example, by using an X-ray microscope or an infrared microscope.

Next, as shown in FIG. 1(B), the surface of the semiconductor block 14B on which the terminal 142 is provided and the resin layer 15 are made to face each other, and the semiconductor block 16B is stacked on the semiconductor chip 14 through the resin layer 15.

At this time, an alignment mark formed on the semiconductor block 14B and an alignment mark formed on the semiconductor block 16B are confirmed to carry out positional alignment.

Then, the semiconductor block 10B, the resin layer 11, the semiconductor block 12B, the resin layer 13, the semiconductor block 14B, the resin layer 15, and the semiconductor block 16B are heated to bond the semiconductor block 14B and the semiconductor block 16B through the resin layer 15 which is in a semi-cured state (B stage). The semiconductor block 10B, the resin layer 11, the semiconductor block 12B, the resin layer 13, the semiconductor block 14B, the resin layer 15, and the semiconductor block 16B are heated by being interposed between the pair of heater-embedded press members, and are compressed by the pair of press members to apply a load thereto, whereby the semiconductor block 14B and the semiconductor block 16B can be bonded to each other. For example, the semiconductor block 14B and the semiconductor block 16B are bonded to each other by using a wafer bonder, a flip chip bonder, and the like in the air under an atmospheric pressure or in the air under a vacuum pressure. A heating temperature is not particularly limited as long as the thermosetting resin of the resin layer 15 is not completely cured, but it is preferable that the heating temperature be lower than a curing temperature of the thermosetting resin.

Whether or not the position of the semiconductor block 14B after the bonding with respect to the semiconductor block 16B is accurate may be confirmed, for example, by using an X-ray microscope or an infrared microscope.

The block stacked body 2B may be obtained as described above. In the block stacked body 2B that is obtained as described above, the resin layers 11, 13, and 15 enter the semi-cured state, and are not completely cured.

In addition, in the process, the solder layers 121A, 141A, and 161A are not melted, and the solder-bonding is not carried out between the terminals 101 and 121, between the terminals 122 and 141, and between the terminals 142 and 161. In addition, the terminals 101 and 121 may come into physical contact with each other, or a resin of the resin layer 11 may be interposed between the terminals 101 and 121. This is of the same as between the terminals 122 and 141, and between the terminals 142 and 161. In addition, in the block stacked body 2B, each side surfaces of the semiconductor block 10B, the resin layer 11, the semiconductor block 12B, the resin layer 13, the semiconductor block 14B, the resin layer 15, and the semiconductor block 16B may be flat (surfaces without a step difference) when viewed from an upper surface, or each of the resin layers 11, 13, and 15 may lie outside the surfaces of the semiconductor blocks 10B, 12B, 14B, and 16B.

In addition, for example, the thickness of each of the resin layers 11, 13, and 15 is preferably 5 μm to 100 μm, and more preferably 10 μm to 50 μm. When the thickness is set to 5 μm or more, the resin layer may reliably cover the solder layer, and thus easy connection may be realized between the terminals 101 and 121, between the terminals 122 and 141, and between the terminals 142 and 161 by flux function of the resin layer. In addition, when the thickness is set to 100 μm or less, easy connection may be realized between the terminals 101 and 121, between the terminals 122 and 141, and between the terminals 142 and 161. In addition, when the thickness is set to 100 μm or less, warpage of the semiconductor blocks 12B, 14B, and 16B due to curing shrinkage of the resin layers may be suppressed, and according to this, warpage of the semiconductor chips 12, 14, and 16 may be suppressed.

Here, description will be made with respect to the resin layers 11, 13, and 15. The resin layers 11, 13, and 15 fill the gap between the semiconductor blocks 10B and 12B, and the gap between the semiconductor blocks 12B and 14B, and the gap between the semiconductor blocks 14B and 16B, respectively.

The resin layers 11, 13, and 15 each contain a thermosetting resin and a flux active compound.

As the thermosetting resin, for example, an epoxy resin, an oxetane resin, a phenol resin, a (meth)acrylate resin, an unsaturated polyester resin, a diallylphthalate resin, a maleimide resin, and the like may be used. These may be used alone or in combination of two or more kinds.

Among these, the epoxy resin that is excellent in curability, storability, heat resistance of a cured material, humidity resistance, and chemical resistance is suitably used. The content of the thermosetting resin in the resin layers 11, 13, and 15 is preferably 30% by weight to 70% by weight.

The resin layers 11, 13, and 15 are resin layers having an function of removing an oxide film on the surface of a solder layer or a terminal during solder-bonding. As the resin layers 11, 13, and 15 have a flux function, the oxide film that covers the surface of the solder or terminal is removed, and thus solder-bonding can be carried out. It is necessary for the resin layers 11, 13, and 15 to contain a flux active compound in order for the resin layers 11, 13, and 15 to have a flux function. The flux active compound that is contained in the resin layers 11, 13, and 15 is not particularly limited as long as the flux active compound is able to be used for the solder-bonding, but a compound which has either a carboxyl group or a phenolic hydroxyl group or both of the carboxyl group and the phenolic hydroxyl group is preferable.

A mixed amount of the flux active compound in the resin layers 11, 13, and 15 is preferably 1% by weight to 30% by weight, and more preferably 3% by weight to 20% by weight.

Examples of the flux active compound having the carboxyl group include aliphatic acid anhydrides, alicyclic acid anhydrides, aromatic acid anhydrides, aliphatic carboxylic acids, aromatic carboxylic acids, and the like.

Examples of the aliphatic acid anhydrides as the flux active compound having the carboxyl group include a succinic anhydride, a polyadipic anhydride, a polyazelaic anhydride, a polysebacic anhydride, and the like.

Examples of the alicyclic acid anhydrides as the flux active compound having the carboxyl group include a methyltetrahydrophthalic anhydride, a methylhexahydrophthalic anhydride, a methylhimic anhydride, a hexahydrophthalic anhydride, a tetrahydrophthalic anhydride, a trialkyltetrahydrophthalic anhydride, a methylcyclohexenedicarboxylic dianhydride, and the like.

Examples of the aromatic acid anhydrides as the flux active compound having the carboxyl group include a phthalic anhydride, a trimellitic anhydride, a pyromellitic anhydride, a benzophenonetetracarboxylic anhydride, ethylene glycol bistrimellitate, glycerol tristrimellitate, and the like.

Examples of the aliphatic carboxylic acids as the flux active compound having the carboxyl group include compounds expressed by the following General Formula (I), formic acid, acetic acid, propionic acid, butyric acid, valeric acid, pivalic acid, caproic acid, caprylic acid, lauric acid, myristic acid, palmitic acid, stearic acid, acrylic acid, methacrylic acid, crotonic acid, oleic acid, fumaric acid, maleic acid, oxalic acid, malonic acid, succinic acid, and the like.

(In Formula (I), n represents an integer of 0 to 20.)

Examples of the aromatic carboxylic acid as the flux active compound having the carboxyl group include benzoic acid, phthalic acid, isophthalic acid, terephthalic acid, hemimellitic acid, trimellitic acid, trimeric acid, mellophanic acid, prehnitic acid, pyromellitic acid, mellitic acid, toluic acid, xylyl acid, hemellitic acid, mesitylene acid, prehnitylic acid, toluic acid, cinnamic acid, salicylic acid, 2,3-dihydroxybenzoic acid, 2,4-dihydroxybenzoic acid, gentisic acid (2,5-dihydroxybenzoic acid), 2,6-dihydroxybenzoic acid, 3,5-dihydroxybenzoic acid, gallic acid (3,4,5-tri-hydroxy benzoic acid), naphthoic acid derivatives such as 1,4-dihydroxy-2-naphthoic acid and 3,5-dihydroxy-2-naphthoic acid, phenolphthalein, diphenolic acid, and the like.

Among the flux active compounds having the carboxyl group, the compounds expressed by General Formula (I) are preferable in consideration of a good balance in activity of the flux active compound, an amount of generated outgas during curing of the resin layer, and a modulus of elasticity or a glass transition temperature of the resin layer after being cured. Among the compound expressed by General Formula (I), compounds in which n in Formula (I) is 3 to 10 are more preferable considering that an increase in the modulus of elasticity in the resin layer after being cured may be suppressed and adhesiveness may be improved.

Among the compounds expressed by General Formula (I), examples of the compound in which n in Formula (I) is 3 to 10 include glutaric acid (HOOC—(CH$_2$)$_3$—COOH) in which n is 3, adipic acid (HOOC—(CH$_2$)$_4$—COOH) in which n is 4, pimelic acid (HOOC—(CH$_2$)$_5$—COOH) in which n is 5, sebacic acid (HOOC—(CH$_2$)$_8$—COOH) in which n is 8, (HOOC—(CH$_2$)$_{10}$—COOH) in which n is 10, and the like.

As the flux active compounds having a phenolic hydroxyl group, phenols may be exemplified. Specific examples of the flux active compound having a phenolic hydroxyl group include monomers containing a phenolic hydroxyl group such as phenol, o-cresol, 2,6-xylenol, p-cresol, m-cresol, o-ethylphenol, 2,4-xylenol, 2,5-xylenol, m-ethylphenol, 2,3-xylenol, mesitol, 3,5-xylenol, p-tertiary butyl phenol, catechol, p-tertiary amyl phenol, resorcinol, p-octylphenol, p-phenyl phenol, bisphenol A, bisphenol F, bisphenol AF, biphenol, diallyl bisphenol F, diallyl bisphenol A, trisphenol, and tetrakisphenol, a phenol novolak resin, an o-cresol novolac resin, a bisphenol F novolac resin, a bisphenol A novolac resin, and the like.

The above-described compound having either the carboxyl group or the phenolic hydroxyl group or both of the carboxyl group and the phenolic hydroxyl group is three-dimensionally taken in by the reaction with a thermosetting resin such as an epoxy resin.

Therefore, from the viewpoint of improving formation of a three-dimensional network of the epoxy resin after being cured, as the flux active compound, a flux active curing agent which has a flux function and which serves as a curing agent of the epoxy resin is preferable. Examples of the flux active curing agent include compounds which have two or more phenolic hydroxyl groups that are capable of being added to the epoxy resin, and one or more carboxyl groups that are directly coupled to an aromatic group exhibiting the flux function (reducing function) in one molecule. Examples of the flux active curing agent include benzoic acid derivatives such as 2,3-dihydroxybenzoic acid, 2,4-dihydroxybenzoic acid, gentisic acid (2,5-dihydroxybenzoic acid), 2,6-dihydroxybenzoic acid, 3,4-dihydroxybenzoic acid, and gallic acid (3,4,5-trihydroxy benzoic acid); naphthoic acid derivatives such as 1,4-dihydroxy-2-naphthoic acid, 3,5-dihydroxy-2-naphthoic acid, and 3,7-dihydroxy-2-naphthoic acid; phenolphthalein; diphenolic acid; and the like. These may be used alone or in combination of two or more kinds.

Among these, it is more preferable to use the phenolphthalein to realize good bonding of the terminals.

In addition, it is preferable that the amount of the flux active curing agent in the resin layer be 1% by weight to 30% by weight, and more preferably 3% by weight to 20% by weight. When the amount of the flux active curing agent in the resin layer is in the above-described range, flux function of the resin layer can be improved, and the flux active curing agent that does not react with the thermosetting resin is prevented from remaining in the resin layer.

In addition, the resin layer may contain an inorganic filler. When the inorganic filler is contained in the resin layer, the lowest melt viscosity of the resin layer is increased, and thus formation of a gap between terminals may be suppressed. Here, examples of the inorganic filler include silica, alumina, and the like.

In addition, the melt viscosity of the resin layer at 60° C. to 150° C. is preferably 0.1 Pa·s to 100,000 Pa·s. According to this, when bonding the resin layer and the semiconductor component, and the like, unevenness of a bump, a pad, and a wiring circuit, and the like of the semiconductor component may be buried with the resin layer in a satisfactory manner. When the melt viscosity is set to 0.1 Pa·s or more, contamination of the semiconductor component and the like due to crawl-up of the melted resin layer is suppressed. In addition, when the melt viscosity is set to 100,000 Pa·s or less, occurrence of electrical conduction failure due to biting-in of the resin layer between terminals of the semiconductor component which face each other is suppressed.

The melt viscosity is more preferably 0.2 Pa·s to 70,000 Pa·s, and still more preferably 0.5 Pa·s to 30,000 Pa·s.

Here, although not particularly limited, the melt viscosity of the resin layer can be measured as follows. For example, measurement with respect to a resin layer having a thickness of 100 μm can be carried out using a viscoelasticity measuring device ("ReoStress RS150" manufactured by HAAKE) under conditions in which a parallel plate is 20 mmφ, a gap is 0.05 mm, a frequency is 0.1 Hz, and a temperature rising rate is 10° C./min.

(First Bonding Process: Process of Bonding Block Stacked Body)

Next, as shown in FIG. 2(A), the block stacked body 2B that is obtained by the above-described process is heated to carry out the solder-bonding of the terminals 101 and 121, the solder-bonding of the terminals 122 and 141, and the solder-bonding of the terminals 142 and 161.

Here, "solder-bonding of the terminals" in the first bonding process represents the following state. The stacked body 2 is heated to a temperature equal to or higher than the melting point of the solder layers 121A, 141A, and 161A. As a result, the respective solder layers 121A, 141A, and 161A, which are used for bonding of the semiconductor chips 10 and 12, bonding of the semiconductor chips 12 and 14, and bonding of the semiconductor chips 14 and 16 are melted, and the terminals 101 and 121, the terminals 122 and 141, and the terminals 142 and 161 come into physical contact with each other, respectively, thereby entering a state in which at least a part forms an alloy.

Figure 3:
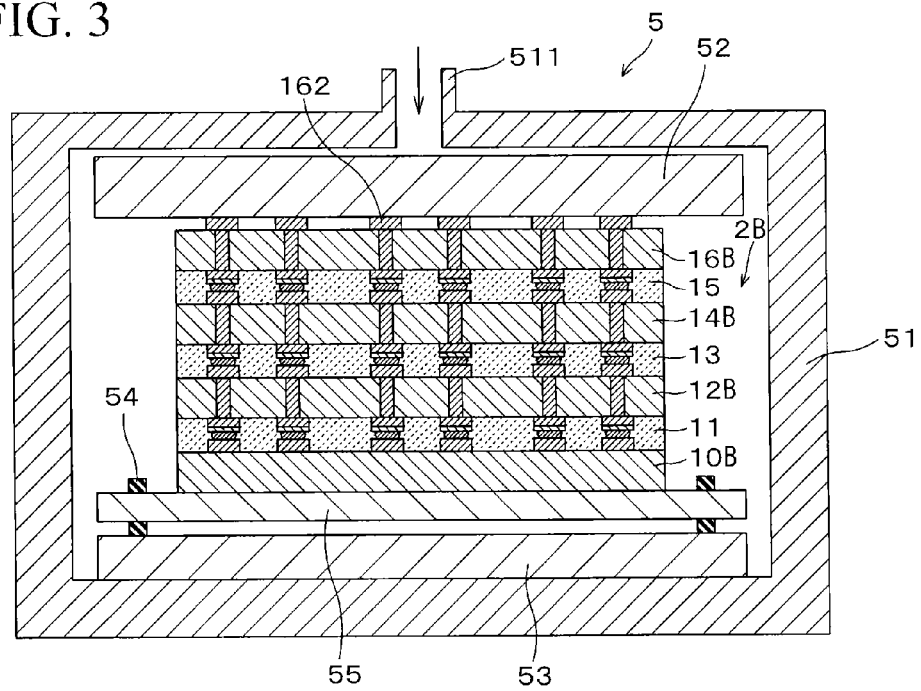
FIG. 3 is a cross-sectional diagram of an apparatus for manufacturing the semiconductor device.

Here, for example, an apparatus 5 shown in FIG. 3 is used. The apparatus 5 includes a container 51 into which a fluid is introduced, and a pair of hot plates (press members) 52 and 53 disposed in the container 51.

The container 51 is a pressure container, and as a material of the container 51, metals and the like are exemplified. Examples of the metals include stainless steel, titanium, and copper.

The hot plates 52 and 53 are press plates including a heater at the inside thereof, and the block stacked body 2B that is provided at an upper side of the hot plate 53 is compressed by the hot plates 52 and 53. A pin 54 is provided to the hot plate 53, and the pin 54 penetrates through a sheet material (a setting portion on which the block stacked body 2B is provided) 55. When compressing the block stacked body 2B, the sheet material 55 slides along the pin 54 and comes into contact with the hot plate 53.

A temperature of the hot plate 52 is set to be higher than a temperature of the hot plate 53. For example, the temperature of the hot plate 52 is higher than the temperature of the hot plate 53 by 20° C. or more. The temperature of the hot plate 52 is set to a temperature equal to or higher than the melting point of the solder layers 121A, 141A, and 161A, and the temperature of the hot plate 53 is set to a temperature lower than the melting point of the solder layers 121A, 141A, and 161A.

First, the hot plates 52 and 53 are heated to a predetermined temperature in advance. The sheet material 55 is spaced away from the hot plate 53, and the block stacked body 2B is provided on the sheet material 55. Next, a fluid is introduced into the container 51 through a pipe 511. As the fluid, a gas is preferable, and examples of the gas include air, an inert gas (a nitrogen gas, an inert gas), and the like.

Then, the hot plate 52 is made to come into contact with the block stacked body 2B while maintaining a state of compressing the block stacked body 2B with a fluid. Further, the sheet material 55 is allowed to slide along the pin 54, and the block stacked body 2B is compressed by the hot plates 52 and 53 along a stacking direction. The block stacked body 2B is heated to a temperature equal to or higher than the melting point of the solder layers 121A, 141A, and 161A to carry out the solder-bonding of the terminals 101 and 121, the solder-bonding of the terminals 122 and 141, and the solder-bonding of the terminals 142 and 161. Since the block stacked body 2B is compressed by the hot plates 52 and 53, even when the resin remains between the terminals 101 and 121 (between the terminals 122 and 141, and between the terminals 142 and 161), the resin may be removed and thus reliable contact can be realized between the terminals 101 and 121 (between the terminals 122 and 141, and between the terminals 142 and 161). As a result, the solder-bonding may be stably carried out.

A compression force when compressing the block stacked body 2B by a fluid is preferably 0.1 MPa to 10 MPa, and more preferably 0.5 MPa to 5 MPa. As the block stacked body 2B is compressed by the fluid, occurrence of voids inside the resin layers 11, 13, and 15 can be suppressed. Particularly, when the compression force is set to 0.1 MPa or more, this effect becomes more significant. In addition, when the compression force is set to 10 MPa or less, an increase in size and complication of the apparatus can be suppressed. In addition, "compression with the fluid" represents that a pressure of an atmosphere of the block stacked body 2B is set to be higher than the atmospheric pressure by the compression force. That is, the compression force 10 MPa represents that a pressure applied to the block stacked body 2B is larger than the atmospheric pressure by 10 MPa.

Here, the block stacked body 2B is heated to a temperature equal to or higher than the melting point of the solder layers 121A, 141A, and 161A, for example, 240° C. to 260° C. for 1 second to 10 minutes. According to this, the solder layers 121A, 141A, and 161A is melted, and thus the solder-bonding can be carried out. In addition, in a case where the melting points of the solder layers 121A, 141A, and 161A are different from each other, the block stacked body 2B may be heated to a temperature equal to or higher than the highest melting point of the solder layers.

Then, the hot plates 52 and 53 are spaced away from each other, and the fluid is discharged from the container 51. The compression of the block stacked body 2B by the fluid is stopped, and then the block stacked body 2B is taken out from the container 51.

Figure 4:
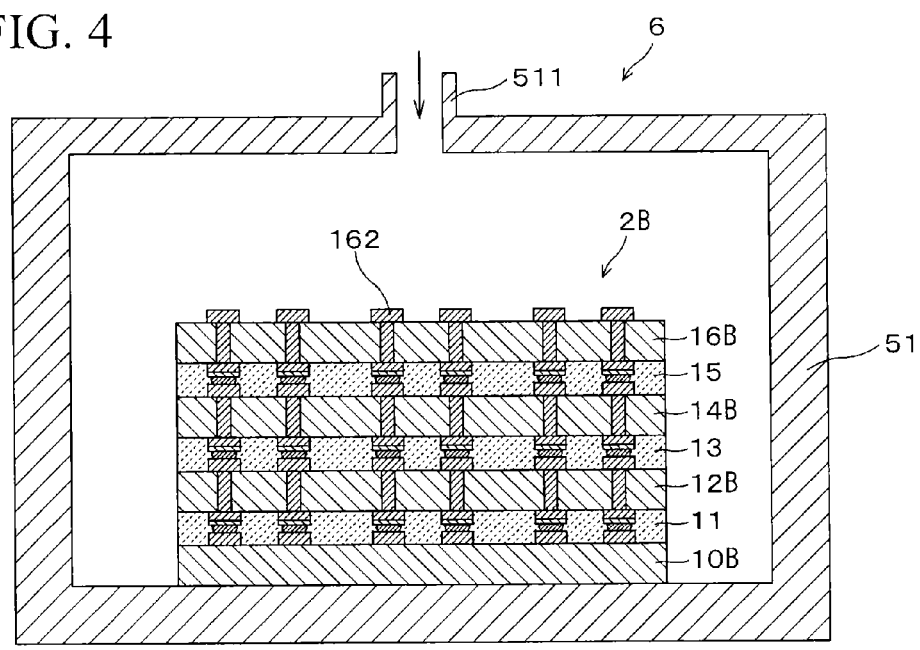
FIG. 4 is a cross-sectional diagram of the apparatus for manufacturing the semiconductor device.
Figure 5:
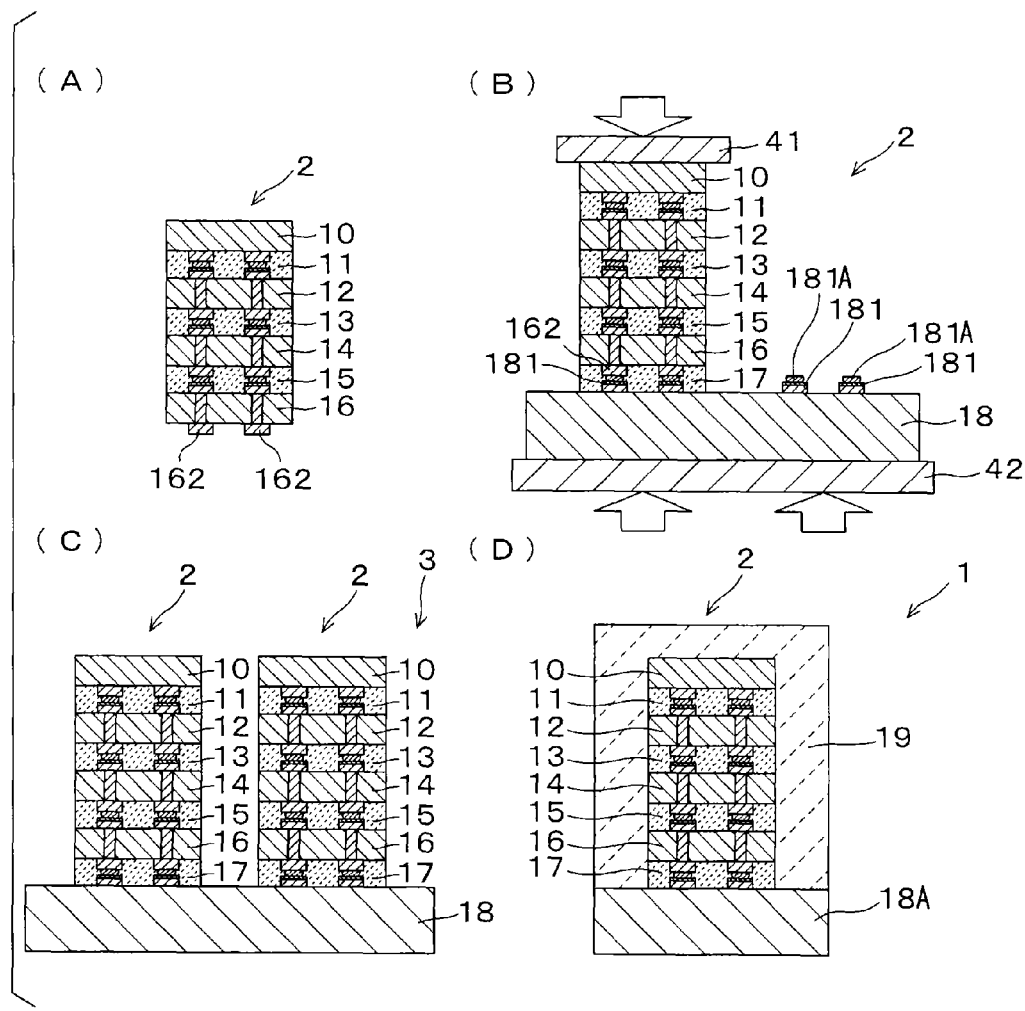
FIG. 5 is a cross-sectional diagram illustrating a process of manufacturing the semiconductor device.

Here, in the first bonding process, in a case where the resin layers 11, 13, and 15 are not completely cured, the curing of the resin layers 11, 13, and 15 may be promoted using an apparatus 6 shown in FIG. 4. The apparatus 6 includes the same container 51 as the apparatus 5 and carries out the curing of the resin layers 11, 13, and 15 by heating the resin layers 11, 13, and 15 while compressing the block stacked body 2B by a fluid. As the fluid, the same fluid as that used in the apparatus 6 is used.

As a method of heating the block stacked body 2B, a method of heating and compressing the block stacked body 2B by introducing a heated fluid into the container 51 via the pipe 511 may be exemplified. In addition, the block stacked body 2B may be heated by heating the container 51 while setting the atmosphere of the container 51 to a compressed atmosphere by introducing the fluid into the container 51 through the pipe 511.

The block stacked body 2B is disposed in the container 51, the fluid is introduced into the container 51, and the curing of the resin layers 11, 13, and 15 of the block stacked body 2B is carried out. At this time, it is preferable to carry out heating to cure the resin layers 11, 13, and 15. Although not particularly limited, it is preferable that a heating temperature be equal to or higher than a curing temperature of a thermosetting resin of the resin layers 11, 13, and 15. For example, it is preferable to carry out the heating at 180° C. for 1 hour. Here, the curing temperature is a curing temperature of the resin layer, and for example, the curing temperature is set as an exothermic peak temperature when carrying out measurement with respect to the resin layers at a temperature rising rate of 10° C./minute using a differential scanning calorimeter (DSC). A range of the curing temperature is preferably 100° C. to 300° C., more preferably 110° C. to 280° C., and still more preferably 120° C. to 260° C.

In addition, the curing of the resin layers 11, 13, and 15 may be carried out after putting a plurality of the block stacked bodies 2B in the container 51 of the apparatus 6. In this case, it is possible to improve productivity.

As described above, the block stacked body 2B, in which the solder-bonding is carried out between the semiconductor blocks 10B and 12B, between the semiconductor blocks 12B and 14B, and between the semiconductor blocks 14B and 16B, is obtained (FIG. 1(B)).

(Cutting Process)

Next, as shown in FIGS. 2(B) and (C), the block stacked body 2B that is obtained in the above-described process is cut to obtain the individual stacked body 2. As a cutting method, a dicing blade, laser, and the like may be used.

(Second Bonding Process: Process of Bonding Base Material)

Next, as shown in FIG. 5(B), the individual stacked body 2, in which the solder-bonding of the semiconductor chips 10 and 12, the solder-bonding of the semiconductor chips 12 and 14, and the solder-bonding of the semiconductor chips 14 and 16 are carried out, is placed on the base material 18 to solder-bond the individual stacked body 2 and the base material 18.

First, the base material 18 is prepared. Here, the base material 18 may be a resin substrate, or may be a silicon substrate, a ceramic substrate, or the like.

The terminal (stacked body connection terminal) 181 is formed on the surface of the base material 18. The terminal 181 is constituted by the same structure and material as the terminal 101, and has the solder layer 181A on the surface thereof. The terminal 181 is connected to the semiconductor chip 16.

Next, a resin layer 17 is provided on the surface of the base material 18. The resin layer 17 is provided to cover the terminal 181. The resin layer 17 may be the same resin layer as the resin layers 11, 13, and 15. For example, a low flow type underfill material (NUF) in a paste shape may be used. To provide the resin layer 17 at a part of the surface of the base material 18, it is preferable to apply the paste-shaped underfill material by a dispenser, an ink jet, and the like.

As the low flow type underfill material, for example, an underfill material disclosed in Japanese Unexamined Patent Application, First Publication No. 2008-13710 may be exemplified. The low flow type underfill material is constituted by a resin composition containing a first epoxy resin being liquid at room temperature, a second epoxy resin having a curing temperature higher than that of the first epoxy resin, a silicone-modified epoxy resin, an inorganic filler, and a curing agent having flux function. The resin composition does not contain a solvent.

As the first epoxy resin, for example, bisphenol type epoxy resins such as a bisphenol A type epoxy resin and a bisphenol F type epoxy resin are preferable.

As the second epoxy resin, an epoxy resin having an allyl group (for example, a diallyl bisphenol A type epoxy resin) is preferable.

In the resin composition, the content of the first epoxy resin is preferably 5% by weight to 50% by weight, and the content of the second epoxy resin is preferably 0.1% by weight to 40% by weight.

As the silicone-modified epoxy resin, a silicone-modified (liquid) epoxy resin having a disiloxane structure may be exemplified, and specifically, a silicone-modified epoxy resin expressed by the following General Formula (1) may be exemplified.

[Chem. 1]

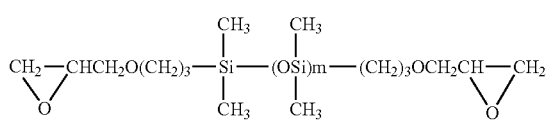

Formula (1)

(m represents an integer of 0 or more)

Although a silicone modification rate of the silicone-modified epoxy resin is not particularly limited, m of the silicone-modified resin is preferably 5 or less, and more preferably 1 or less.

More specifically, the silicone-modified epoxy resin is preferably synthesized by a heating reaction of a silicone-modified liquid epoxy resin in which m of the silicone-modified liquid epoxy resin expressed by General Formula (1) is 0 and phenols expressed by the following General Formula (2). According to this, wettability to the base material and the semiconductor chip may be improved.

[Chem. 2]

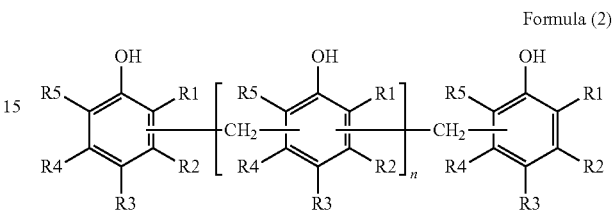

Formula (2)

(R1 to R5 may be the same as each other or different from each other and each represent a group selected from a hydrogen atom, an alkyl group, and allyl group, and n represents an integer of 0 or more.)

Although not particularly limited, a molar ratio (a molar ratio of an epoxy group of the silicone-modified epoxy resin/a molar ratio of an hydroxyl group of the phenols) between the silicone-modified liquid epoxy resin in which m of the silicone-modified liquid epoxy resin expressed by General Formula (1) is 0 and the phenols expressed by General Formula (2) is preferably 1 to 10, and more preferably 1 to 5. When the molar ratio is in the above-described range, a yield ratio, low volatility, and the like of a reactant are particularly excellent.

The content of the silicone-modified epoxy resin is preferably 0.1% by weight to 20% by weight on the basis of the entirety of the resin composition.

Further, with regard to the curing agent having flux function, it is preferable to use two or more kinds having melting points different from each other.

Preferred examples of a first flux active curing agent include 2,3-dihydroxybenzoic acid, 2,4-dihydroxybenzoic acid, 2,5-dihydroxybenzoic acid, 2,6-dihydroxybenzoic acid, and 3,4-dihydroxybenzoic acid.

In addition, preferred examples of a second flux active curing agent include o-phthalic acid, trimellitic acid, hexahydrophthalic acid, methyl hexahydrophthalic acid, 4-hydroxy (o-phthalic acid), 3-hydroxy(o-phthalic acid), tetrahydro phthalic acid, and maleic acid. In addition, preferred examples of the second flux active curing agent that contain an alkylene group include succinic acid, malonic acid, glutaric acid, malic acid, sebacic acid, adipic acid, azelaic acid, suberic acid, pimelic acid, 1,9-nonanedicarboxylic acid, dodecanedioic acid, and the like. These may be used alone or in combination of two or more kinds. Among these, the sebacic acid is preferable.

After the resin layer 17 is provided on the base material 18, the individual stacked body 2 is mounted on the resin layer 17. The individual stacked body 2 is provided on the resin layer 17 in such a manner that the terminal 162 of the individual stacked body 2 is located on a side of the resin layer 17.

At this time, an alignment mark formed on the individual stacked body 2 and an alignment mark formed on the base material 18 are confirmed to carry out positional alignment.

The individual stacked body 2, the resin layer 17, and the base material 18 are heated to a temperature equal to or higher than the melting point of the solder layer 181A while compressing the individual stacked body 2, the resin layer 17, and the base material 18 in a stacked direction by the pair of press members 41 and 42. The individual stacked body 2, the resin layer 17, and the base material 18 are compressed by the pair of press members 41 and 42 and the pair of press members 41 and 42 are heated, and thus the individual stacked body 2, the resin layer 17, and the base material 18 are heated to a temperature equal to or higher than the melting point of the solder layer 181A. According to this, the terminal 181 and the terminal 162 are solder-bonded to each other. In the bonding process, for example, the individual stacked body 2 is solder-bonded one by one to the base material 18 using, for example, a flip chip bonder.

In this manner, a plurality of the individual stacked bodies 2 are provided on the base material 18, and the base material 18 and the plurality of individual stacked bodies 2 are solder-bonded to each other, thereby obtaining a structure body 3 (refer to FIG. 5(C)).

Then, the resin layer 17 of the structure body 3 is cured as necessary. Here, the curing of the resin layer 17 is carried out using the above-described apparatus 6 in FIG. 4. A curing method is the same as the above-described method, and the curing of the resin layer 17 is carried out by heating the structure body 3 to a temperature equal to or higher than a curing temperature of the thermosetting resin of the resin layer 17 while compressing the structure body 3 by a fluid.

In this manner, it is possible to prevent voids from being generated in the resin layer 17, and it is possible to remove voids that occur.

(Encapsulating Process)

Next, encapsulating of the structure body 3 is carried out. A encapsulating method may be any one of potting, transfer molding, and compression molding.

Then, cutting is carried out for each individual stacked body 2 to obtain a plurality of the semiconductor devices 1 shown in FIG. 5(D). In addition, in FIG. 5(D), a reference numeral 19 represents a encapsulating material, and a reference numeral 18A represents the base material 18 that is diced (cut). In addition, in a case where the semiconductor device 1 includes the plurality of individual stacked bodies 2, the cutting may be carried out for each unit of the semiconductor device 1. In addition, a dicing blade, laser, a router, and the like can be used for the cutting.

According to the above-described embodiment, the following effects can be obtained.

In the embodiment, since the semiconductor block 10B, the resin layer 11, the semiconductor block 12B, the resin layer 13, the semiconductor block 14B, the resin layer 15, and the semiconductor block 16B are stacked in this order to obtain the block stacked body 2B, and then the entirety of the block stacked body 2B is heated to carry out solder-bonding, it is possible to further reduce thermal damage applied to the respective semiconductor chips 10, 12, 14, and 16 as in comparison to the related art. Accordingly, it is possible to improve reliability of the semiconductor device 1.

In addition, since the semiconductor block 10B, the resin layer 11, the semiconductor block 12B, the resin layer 13, the semiconductor block 14B, the resin layer 15, and the semiconductor block 16B are stacked in this order to obtain the block stacked body 2B, and then the entirety of the block stacked body 2B is heated to simultaneously carry out the solder-bonding of the terminals 101 and 121, the solder-bonding of the terminals 122 and 141, and the solder-bonding of the terminals 142 and 161. Accordingly, it is possible to further improve productivity during the solder-bonding compared to a case in which a plurality of semiconductor components are stacked while sequentially carrying out the solder-bonding of semiconductor components.

In addition, in the embodiment, when obtaining the block stacked body 2B, heating is carried out each time the semiconductor block to which the resin layer is attached is stacked over the semiconductor block 10B. However, the heating at this time is heating to bond the semiconductor blocks by the resin layer. Accordingly, a heating time is relatively short, and a heating temperature may be low, and thus even when carrying out the process of obtaining the block stacked body 2B, it is possible to further improve productivity compared to a manufacturing method in the related art.

Further, in the embodiment, the solder-bonding is carried out by compressing the block stacked body 2B.

In the related art, since the solder-bonding is carried out by the compressing each time a semiconductor chip is stacked, a lower-layer semiconductor chip is compressed plural times, and thus the lower-layer semiconductor chip has a tendency to be susceptible to damage.

On the contrary, in the embodiment, since the semiconductor block 10B, the resin layer 11, the semiconductor block 12B, the resin layer 13, the semiconductor block 14B, the resin layer 15, and the semiconductor block 16B are stacked in this order to obtain the block stacked body 2B, the solder-bonding is carried out by compressing the block stacked body 2B. Compressing is prevented from being carried out plural times during the solder-bonding, and thus the damage applied to the semiconductor blocks 10B, 12B, 14B, and 16B is reduced.

In the embodiment, after the solder-bonding is carried out between the terminals 101 and 121, between the terminals 122 and 141, and between the terminals 142 and 161 of the block stacked body 2B, and the block stacked body 2B is cut to obtain the individual stacked body 2, the solder-bonding of the base material 18 and the individual stacked body 2 is carried out.

In addition, in the embodiment, the solder-bonding is carried out in advance between the terminals 101 and 121, between the terminals 122 and 141, and between the terminals 142 and 161 of the block stacked body 2B. Since the block stacked body 2B has a structure in which a resin layer having a relatively high coefficient of linear expansion is interposed between the semiconductor blocks having a relatively low coefficient of linear expansion, even when heat is applied during the solder-bonding, warpage is not likely to occur. Accordingly, in the block stacked body 2B, it is possible to prevent misalignment from occurring between the terminals 101 and 121, between the terminals 122 and 141, and between the terminals 142 and 161, and thus it is possible to improve reliability of the semiconductor device 1.

Further, in the embodiment, when carrying out the solder-bonding of the terminals 101 and 121, the solder-bonding of the terminals 122 and 141, and the solder-bonding of the terminals 142 and 161 of the block stacked body 2B, the block stacked body 2B is compressed by the fluid and is heated. Since the block stacked body 2B is compressed by the fluid, it is possible to prevent voids from occurring in the resin layers 11, 13, and 15 of the block stacked body 2B. In addition, since the block stacked body 2B is compressed by the fluid, voids present in the resin layers 11, 13, and 15 of the block stacked body 2B are compressed and thus become small. As described above, it is possible to prevent a positional misalignment from occurring between terminals due to the voids. In addition, it is possible to prevent the resin layers 11, 13, and 15 from being extruded by the voids, and thus it is possible to prevent the apparatus 5 from being contaminated.

In addition, in the process of preparing the block stacked body 2B, when stacking of the semiconductor blocks to which the resin layer is attached is carried out in a vacuum pressure, for example, a gas is not likely to enter an interface between the resin layer 11 and the semiconductor block 10B, and thus it is possible to reduce voids during the solder-bonding.

In addition, as described above, in the related art, semiconductor chips are solder-bonded each time a semiconductor chip is stacked on a semiconductor chip. When carrying out the compression by the fluid during the solder-bonding, another semiconductor chip is stacked on a semiconductor chip, and then the semiconductor chip stacked body is put into the container 51 of the apparatus 5, and then the solder-bonding is carried out. Further, the semiconductor chip stacked body is taken out from the apparatus 5. Then, it is necessary to once again stack another semiconductor chip, and thus putting and taking-out of the semiconductor chip stacked body into and from the apparatus 5 are repeated. Accordingly, it takes a lot of time and effort, and thus it is difficult to carry out the solder-bonding while compressing the semiconductor chip by the fluid.

On the contrary, in the embodiment, since the block stacked body 2B in which the semiconductor blocks 10B, 12B, 14B, and 16B are stacked in advance is formed, and the entirety of the block stacked body 2B is heated to carry out the solder-bonding of the terminals 101 and 121, the solder-bonding of the terminals 122 and 141, and the solder-bonding of the terminals 142 and 161 at a time, the solder-bonding can be carried out while carrying out compression under a fluid atmosphere.

In the embodiment, the solder-bonding of the terminals 101 and 121, the solder-bonding of the terminals 122 and 141, and the solder-bonding of the terminals 142 and 161 of the block stacked body 2B is carried out using the apparatus 5. Here, the sheet material 55 on which the block stacked body 2B is provided is disposed to be spaced away from the pair of hot plates 52 and 53. According to this, it is difficult for heat transferred from the hot plates 52 and 53 to be applied to the block stacked body 2B. Accordingly, until the block stacked body 2B is compressed by the fluid at a predetermined compression force after the block stacked body 2B is provided inside the apparatus 5, enlargement of voids in the resin layers 11, 13, and 15 due to softening of the resin layers 11, 13, and 15 of the block stacked body 2B is prevented.

In addition, when the temperature of the hot plate 53 is set to be lower than that of the hot plate 52, until the block stacked body 2B is compressed by the fluid at a predetermined compression force after the block stacked body 2B is provided inside the apparatus 5, enlargement of voids in the resin layers 11, 13, and 15 due to softening of the resin layers 11, 13, and 15 of the block stacked body 2B is prevented. On the other hand, when the temperature of the hot plate 52 is set to be higher than that of the hot plate 53, it is possible to raise a temperature of the block stacked body 2B to a predetermined temperature in a relatively short time after compressing the block stacked body 2B.

In addition, in a case where the sheet material 55 is disposed in the vicinity of the hot plate 52, the temperature of the hot plate 52 may be set to be lower than the temperature of the hot plate 53.

In addition, in the embodiment, in the process of preparing the block stacked body 2B, the semiconductor blocks 10B and 12B are bonded to each other through the resin layer 11 in a semi-cured state. Similarly, the semiconductor blocks 12B and 14B are bonded to each other through the resin layer 13 in a semi-cured state, and the semiconductor blocks 14B and 16B are bonded to each other through the resin layer 15 in a semi-cured state. In this manner, since the semiconductor blocks are bonded to each other, in the block stacked body 2B, the semiconductor chips are prevented from positionally misaligning between the semiconductor blocks.

In addition, when bonding the semiconductor blocks 12B and 14B through the resin layer 13 in a semi-cured state and when bonding the semiconductor blocks 14B and 16B through the resin layer 15 in a semi-cured state, heat is applied to the semiconductor blocks 10B, 12B, and 14B plural times, but this heat is applied to bond the semiconductor chips to each other by the resin layer in a semi-cured state. Therefore, the heating temperature may be set to be relatively low. In addition, even when the heating temperature is set to be high, a heating time may be relatively short. Accordingly, it is considered that an effect on the semiconductor blocks 10B, 12B, and 14B due to the heat is very small.

Further, in the embodiment, at a preceding stage of constituting the block stacked body 2B, the resin layer 11 is provided to the semiconductor block 12B. Similarly, the resin layer 13 is provided to the semiconductor block 14B, and the resin layer 15 is provided to the semiconductor block 16B. All of the semiconductor blocks 12B, 14B, and 16B have a TSV structure, and have a very small thickness. Accordingly, when the resin layers 11, 13, and 15 are provided, warpage of the semiconductor blocks 12B, 14B, and 16B is prevented from occurring, and thus excellent handability can be achieved.

In addition, in the embodiment, the plurality of individual stacked bodies 2 are solder-bonded to the base material 18, and then encapsulating is carried out. Then, cutting is carried out. According to this, it is possible to improve productivity of the semiconductor device 1.

Second Embodiment

Figure 6:
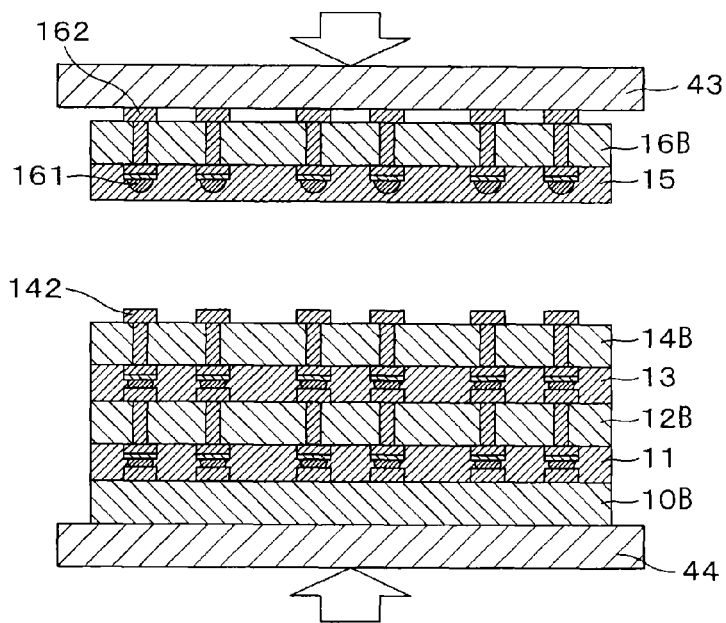
FIG. 6 is a cross-sectional diagram illustrating a process of manufacturing a semiconductor device according to a second embodiment.
Figure 6:
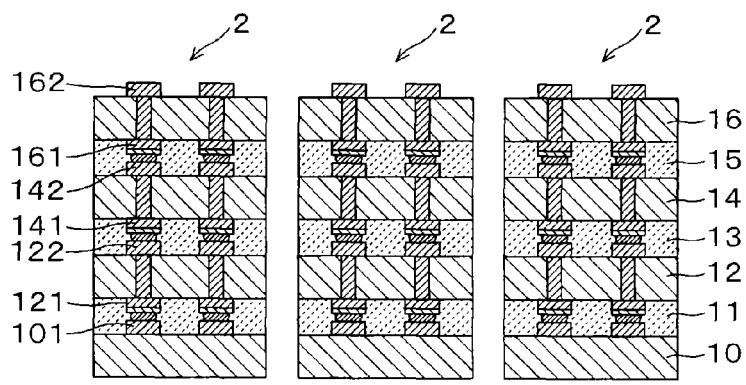
Figure 6:
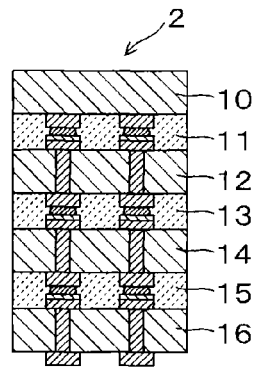

A second embodiment of the invention will be described with reference to FIG. 6.

In the embodiment, similar to the above-described embodiment, as shown in FIG. 6(A), the semiconductor block 12B is stacked on the semiconductor block 10B through the resin layer 11, and heating is carried out. According to this, the semiconductor block 10B and the semiconductor block 12B are bonded to each other through the resin layer 11 in a semi-cured state.

Similarly, the semiconductor block 14B is stacked on the semiconductor block 12B through the resin layer 13 in a semi-cured state to bond the semiconductor blocks 12B and 14B to each other. The solder layers 121A and 141A are not melted, and the solder-bonding of the terminals 101 and 121 and the solder-bonding of the terminals 122 and 141 is not carried out.

Then, as shown in FIG. 6(A), the semiconductor block 16B to which the resin layer 15 is attached is assembled to the press member 43. On the other hand, a stacked body constituted of the semiconductor block 10B, the resin layer 11, the semiconductor block 12B, the resin layer 13 and the semiconductor block 14B is provided on the press member 44.

Next, the press members 44 and 43 are made to approach each other, whereby the resin layer 15 of the semiconductor block 16B to which the resin layer 15 is attached is brought into contact with the semiconductor block 14B. According to this, the block stacked body 2B is configured. However, here, the semiconductor block 16B is not bonded to the semiconductor block 14B through the resin layer 15.

Then, the temperature of heaters inside the press members 44 and 43 starts to rise. The block stacked body 2B is heated to a temperature equal to or higher than the melting point of the solder layer 121A, 141A, and 161A through the press members 44 and 43, and the block stacked body 2B is compressed by the press members 44 and 43, and thus the solder-bonding of the terminals 101 and 121, the solder-bonding of the terminals 122 and 141, and the solder-bonding of the terminals 142 and 161 is carried out.

Here, for example, the solder-bonding can be carried out using a wafer bonder, a flip chip bonder, and the like.

In addition, as is the case with the first embodiment, in this embodiment, the solder-bonding may also be carried out while compressing the block stacked body 2B by the fluid.

Next, the resin layers 11, 13, and 15 of the block stacked body 2B, in which the solder-bonding is carried out between the terminals 101 and 121, between the terminals 122 and 141, and between the terminals 142 and 161, is cured. Similar to the above-described embodiment, the curing of the resin layers 11, 13, and 15 may be carried out using the apparatus 6.

The subsequent processes are the same as the above-described embodiment.

According to this embodiment, the same effects as that of the above-described embodiment can be achieved, and the following effect can be achieved.

In this embodiment, since the process of bonding the semiconductor block 16B and the semiconductor block 14B through the resin layer 15 is not carried out, it is possible to improve productivity.

Third Embodiment

Figure 7:
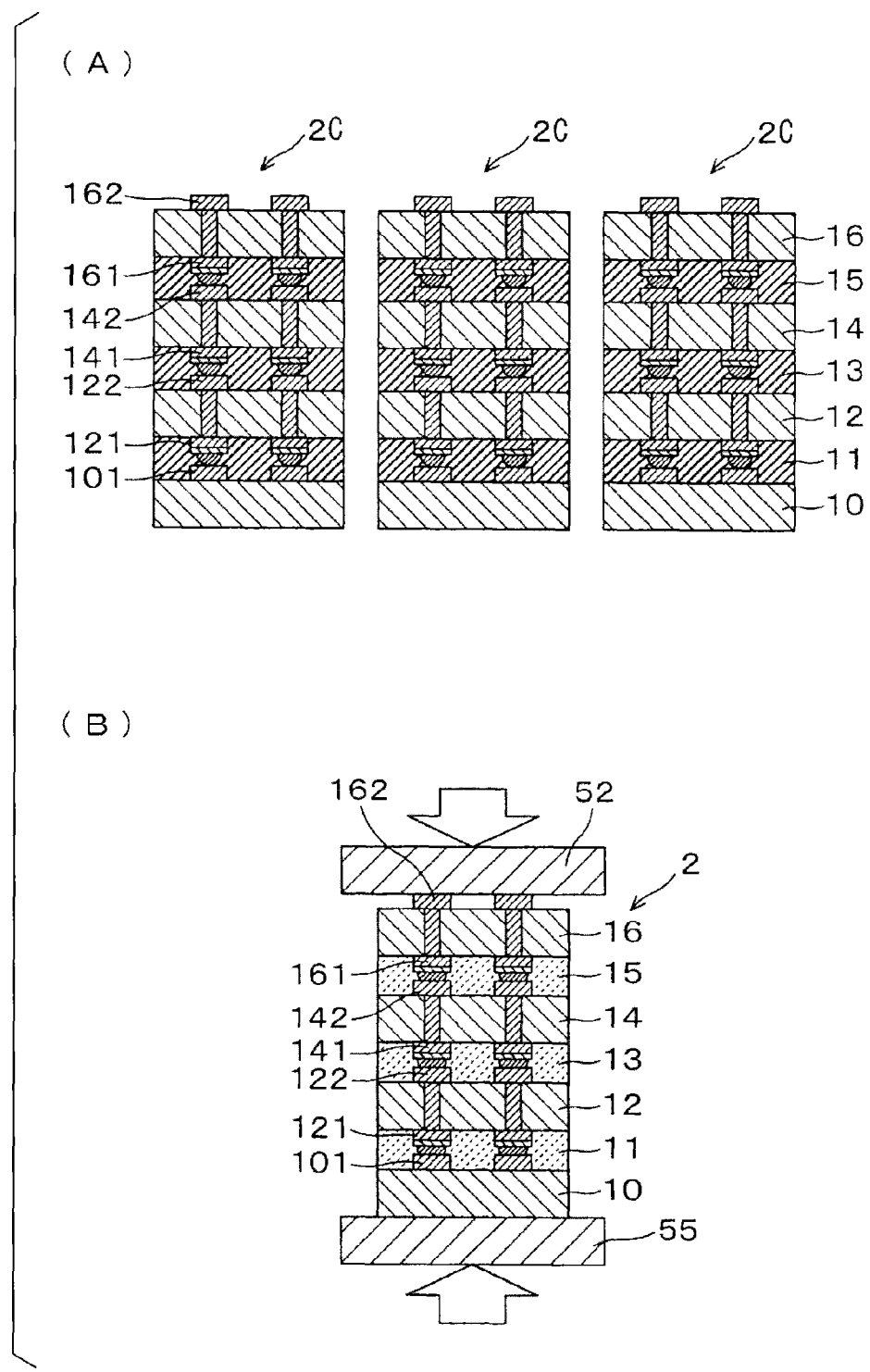
FIG. 7 is a cross-sectional diagram illustrating a process of manufacturing a semiconductor device according to a third embodiment.
Figure 8:
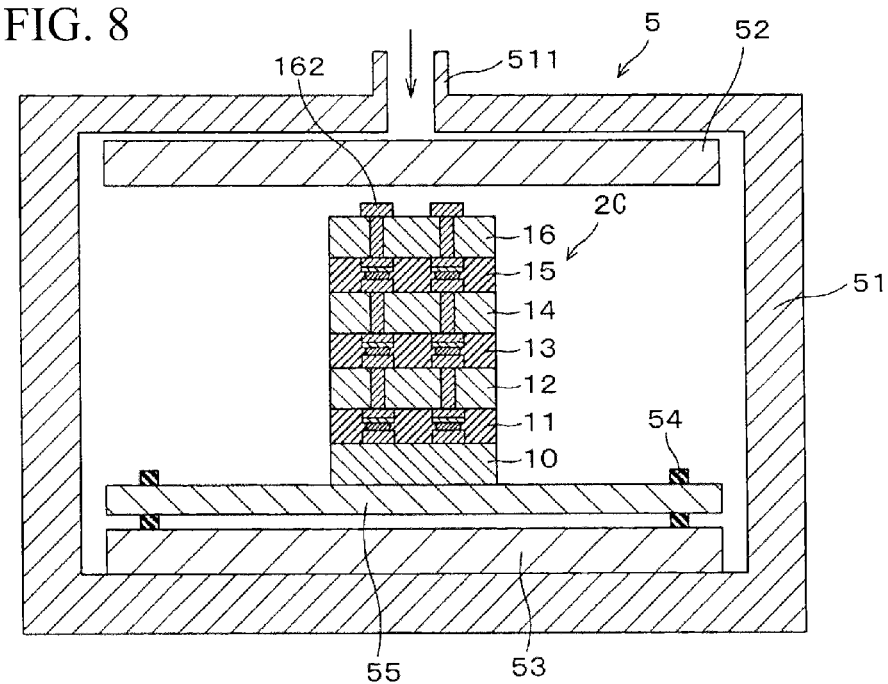
FIG. 8 is a cross-sectional diagram of an apparatus for manufacturing the semiconductor device according to the third embodiment.
Figure 9:
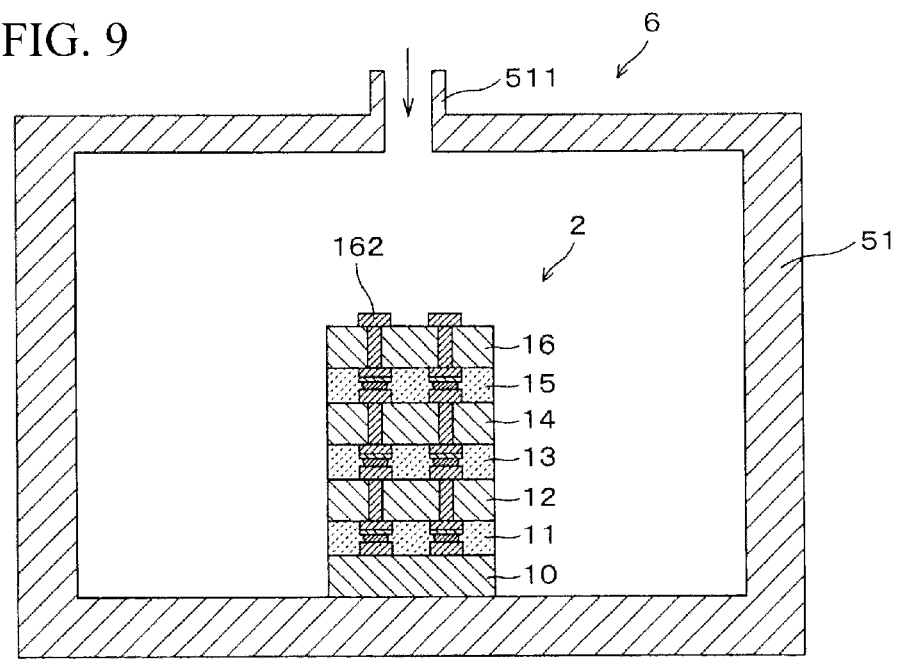
FIG. 9 is a cross-sectional diagram of the apparatus for manufacturing the semiconductor device according to the third embodiment.

FIGS. 7 to 9 show a method of manufacturing the semiconductor device of this embodiment.

First, the outline of the method of manufacturing the semiconductor device 1 of the embodiment will be described.

The method of manufacturing the semiconductor device 1 of this embodiment includes a sequential stacking process, a cutting process, a first bonding process (sequential stacked body bonding process), and a second bonding process (base material bonding, process).

In the sequential stacking process, the first semiconductor block 10B in which semiconductor chips (first semiconductor components) 10 are arranged, the resin layer (first resin layer) 11, the second semiconductor block 12B in which semiconductor chips (second semiconductor components) 12 are arranged, the resin layer (second resin layer) 13, the third semiconductor block 14B in which semiconductor chips (third semiconductor components) 14 are arranged, the resin layer (third resin layer) 15, and the fourth semiconductor block 16B in which semiconductor chips (fourth semiconductor components) 16 are arranged are bonded to obtain the block stacked body 2B.

Here, each of the semiconductor blocks in which a plurality of semiconductor components are arranged may have any shape such as a wafer size shape, a block shape in which a plurality of semiconductor components are arranged and which is processed in a rectangular shape, and a shape in which a plurality of semiconductor components are arranged and in which the semiconductor components are not arranged in a peripheral portion. In addition, a configuration of stacking the semiconductor blocks may employ a case in which stacking is carried out in a wafer size, and a case in which block size stacking is carried out in a wafer size.

In the cutting process, the block stacked body 2B is cut in the size of a sequential stacked body 2C that is a unit of the stacked semiconductor chip (semiconductor component).

In addition, the sequential stacked body represents an individual stacked body in a state in which the connection terminals of the stacked semiconductor chips (semiconductor components) are not solder-bonded.

In the first bonding process (sequential stacked body bonding process), the sequential stacked body 2C, which is obtained by stacking the semiconductor chip 10, the resin layer 11, the semiconductor chip 12, the resin layer 13, the semiconductor chip 14, the resin layer 15, and the semiconductor chip 16, and in which the solder-bonding is not carried out between the semiconductor chips 10 and 12, between the semiconductor chips 12 and 14, and between the semiconductor chips 14 and 16, is heated to carry out the solder-bonding of the semiconductor chips 10 and 12, the solder-bonding of the semiconductor chips 12 and 14, and the solder-bonding of the semiconductor chips 14 and 16, thereby obtaining the individual stacked body 2.

Then, the individual stacked body 2 in which the solder-bonding is carried out is provided on the base material 18. The individual stacked body 2 is provided on the base material 18 in such a manner that the connection terminal 162 of the individual stacked body 2 which is to be connected to the base material 18 and the connection terminal 181 of the base material 18 which is to be connected to the individual stacked body 2 come into contact with each other.

Next, in the second bonding process (base material bonding process), the individual stacked body 2 and the base material 18 are heated to a temperature equal to or higher than a melting point of a solder layer 181A of the connection terminal 181 to solder-bond the individual stacked body 2 to the base material 18.

Next, a method of manufacturing the semiconductor device 1 according to this embodiment will be described in detail.

First, as shown in FIGS. 1(A) and (B), the semiconductor block 10B, the resin layer 11, the semiconductor block 12B, the resin layer 13, the semiconductor block 14B, the resin layer 15, and the semiconductor block 16B are prepared. This process can be carried out in the same manner as the first embodiment, and thus detailed description thereof will not be repeated here.

(Sequential Stacking Process: Process of Preparing Block Stacked Body)

Next, as shown in FIG. 1(B), the block stacked body 2B that is constituted by the semiconductor block 10B, the resin layer 11, the semiconductor block 12B, the resin layer 13, the semiconductor block 14B, the resin layer 15, and the semiconductor block 16B is prepared. This process can be carried out in the same manner as the first embodiment, and thus detailed description thereof will not be repeated.

(Cutting Process)

Next, as shown in FIG. 7(A), the block stacked body 2B that is obtained in the above-described process is cut to obtain the sequential stacked body 2C that is a stacked semiconductor component. As a cutting method, a dicing blade, laser, and the like may be used.

(First Bonding Process: Process of Bonding Sequential Stacked Body)

Next, as shown in FIG. 7(B), the sequential stacked body 2C that is obtained in the above-described process is heated to carry out the solder-bonding of the terminals 101 and 121, the solder-bonding of the terminals 122 and 141, and the solder-bonding of the terminals 142 and 161.

Here, the "solder-bonding of the terminals" in the first bonding process represents the following state. The sequential stacked body 2C is heated to a temperature equal to or higher than the melting point of the solder layers 121A, 141A, and 161A, and thus the respective solder layers 121A, 141A, and 161A that are used for bonding of the semiconductor chips 10 and 12, bonding of the semiconductor chips 12 and 14, and bonding of the semiconductor chips 14 and 16 are melted, and the terminals 101 and 121, the terminals 122 and 141, and the terminals 142 and 161 come into physical contact with each other, respectively, and at least a part forms an alloy.

This process can be carried out in the same manner as the bonding of the block structure body in the first embodiment by using the sequential stacked body 2C instead of the block stacked body 2B in the first embodiment. In this process, the bonding can be carried out using the same apparatuses as the apparatuses 5 and 6 in the first embodiment (refer to FIGS. 8 and 9). Accordingly, detailed description thereof will not be repeated here.

As described above, the individual stacked body 2, in which the solder-bonding is carried out between the semiconductor chips 10 and 12, between the semiconductor chips 12 and 14, and between the semiconductor chips 14 and 16, is obtained (FIG. 5(A)).

The subsequent second bonding process (base material bonding process) and encapsulating process can be carried out in the same manner as the first embodiment, and thus here, detailed description thereof will not be repeated.

According to the above-described embodiment, the following effect can be achieved.

Since the solder-bonding is carried out by heating the entirety of the sequential stacked body 2C, accordingly, it is possible to further reduce thermal damage that is applied to the respective semiconductor chips 10, 12, 14, and 16 as in comparison to the related art. As a result, reliability of the semiconductor device 1 can be improved.

In addition, since the semiconductor block 10B, the resin layer 11, the semiconductor block 12B, the resin layer 13, the semiconductor block 14B, the resin layer 15, and the semiconductor block 16B are stacked in this order to obtain the block stacked body 2B, and then the entirety of the sequential stacked body 2C that is obtained by cutting the block stacked body 2B is heated to carry out the solder-bonding of the terminals 101 and 121, the solder-bonding of the terminals 122 and 141, and the solder-bonding of the terminals 142 and 161. Accordingly, it is possible to further improve productivity during the solder-bonding compared to a case in which a plurality of semiconductor components are stacked while sequentially carrying out the solder-bonding for semiconductor components.

In addition, in this embodiment, when obtaining the block stacked body 2B, heating is carried out each time the semiconductor block to which the resin layer is attached is stacked over the semiconductor block 10B. However, the heating at this time is heating to bond the semiconductor blocks by the resin layer. Accordingly, a heating time is relatively short, and a heating temperature may be low, and thus even when carrying out the process of obtaining the block stacked body 2B and the subsequent process of obtaining the sequential stacked body 2C, it is possible to further improve productivity compared to a manufacturing method in the related art.

Further, in the embodiment, the solder-bonding is carried out by compressing the sequential stacked body 2C.

In the related art, since the solder-bonding is carried out by the compressing each time a semiconductor chip is stacked, a lower-layer semiconductor chip is compressed plural times, and thus the lower-layer semiconductor chip has a tendency to be susceptible to damage.

On the contrary, in the embodiment, since the semiconductor block 10B, the resin layer 11, the semiconductor block 12B, the resin layer 13, the semiconductor block 14B, the resin layer 15, and the semiconductor block 16 are stacked in this order to obtain the block stacked body 2B, and then the solder-bonding is carried out by compressing the sequential stacked body 2C that is obtained by cutting the block stacked body 2B. Compressing is prevented from being carried out plural times during the solder-bonding, and thus the damage applied to the semiconductor chips 10, 12, 14, and 16 is reduced.

In the embodiment, after the solder-bonding is carried out between the terminals 101 and 121, between the terminals 122 and 141, and between the terminals 142 and 161 of the sequential stacked body 2C, the solder-bonding of the base material 18 and the individual stacked body 2 is carried out.

A method of carrying out the solder-bonding of the terminals 101 and 121, the solder-bonding of the terminals 122 and 141, the solder-bonding of the terminals 142 and 161, and the solder-bonding of the terminals 181 of the base material 18 and the terminal 162 by heating the sequential stacked body 2C and the base material 18 after providing the sequential stacked body 2C on the base material 18, wherein the solder-bonding is not carried out between the terminals 101 and 121, between the terminals 122 and 141, and between the terminals 142 and 161 may be considered.

However, in this method, in a case where a difference in a coefficient of linear expansion between the base material 18 and the sequential stacked body 2C is large, stress that occurs due to the difference in the coefficient of linear expansion acts on the sequential stacked body 2C, and thus there is a possibility that misalignment occurs in the sequential stacked body 2C.

On the contrary, like this embodiment, when the solder-bonding of the terminals 101 and 121, the solder-bonding of the terminals 122 and 141, and the solder-bonding of the terminal 142 and 161 is carried out in advance, and then the solder-bonding of the individual stacked body 2 and the base material 18 is carried out, it is possible to prevent the misalignment from occurring in the sequential stacked body 2C or the individual stacked body 2.

In addition, in this embodiment, the solder-bonding is carried out in advance between the terminals 101 and 121, the terminals 122 and 141, and the terminal 142 and 161 of the sequential stacked body 2C. Since the sequential stacked body 2C has a structure in which a resin layer having a relatively high coefficient of linear expansion is interposed between the semiconductor chips having a low coefficient of linear expansion, even when heat is applied during the solder-bonding, warpage is not likely to occur. Accordingly, in the sequential stacked body 2C or the individual stacked body 2, it is possible to prevent misalignment from occurring between the terminals 101 and 121, between the terminals 122 and 141, and between the terminals 142 and 161, and thus it is possible to improve reliability of the semiconductor device 1.

Further, in this embodiment, when carrying out the solder-bonding of the terminals 101 and 121, the solder-bonding of the terminals 122 and 141, and the solder-bonding of the terminals 142 and 161 of the sequential stacked body 2C, the sequential stacked body 2C is compressed by the fluid and is heated. Since the sequential stacked body 2C is compressed by the fluid, it is possible to prevent voids from occurring in the resin layers 11, 13, and 15 of the sequential stacked body 2C. In addition, since the sequential stacked body 2C is compressed by the fluid, voids present in the resin layers 11, 13, and 15 of the sequential stacked body 2C are compressed and thus become small. As described above, it is possible to prevent a positional misalignment from occurring between terminals due to the voids. In addition, it is possible to prevent the resin layers 11, 13, and 15 from being extruded by the voids, and thus it is possible to prevent the apparatus 5 from being contaminated.

In addition, in the process of preparing the block stacked body 2B, when stacking of the semiconductor chips to which the resin layer is attached is carried out in a vacuum pressure, for example, a gas is not likely to enter an interface between the resin layer 11 and the semiconductor block 10B, and thus it is possible to reduce voids during the solder-bonding of the sequential stacked body 2C.

In addition, as described above, in the related art, semiconductor chips are solder-bonded each time a semiconductor chip is stacked on a semiconductor chip. When carrying out the compression by the fluid during the solder-bonding, another semiconductor chip is stacked on a semiconductor chip, and then the semiconductor chip stacked body is put into the container 51 of the apparatus 5, and then the solder-bonding is carried out. Further, the semiconductor chip stacked body is taken out from the apparatus 5. Then, it is necessary to further stack another semiconductor chip, and thus putting and taking-out of the semiconductor chip stacked body into and from the apparatus 5 are repeated. Accordingly, it takes a lot of time and effort, and thus it is difficult to carry out the solder-bonding while compressing the semiconductor chip by the fluid.

On the contrary, in this embodiment, since the sequential stacked body 2C in which the semiconductor chips 10, 12, 14, and 16 are stacked in advance is formed, and the entirety of the sequential stacked body 2C is heated to carry out the solder-bonding of the terminals 101 and 121, the solder-bonding of the terminals 122 and 141, and the solder-bonding of the terminals 142 and 161 at a time, the solder-bonding can be carried out while carrying out compression under a fluid atmosphere. In addition, after constituting the block stacked body 2B, the sequential stacked body 2C that is obtained by cutting the block stacked body 2B is heated to carry out the solder bonding, and thus an area of the semiconductor components that are solder-bonded decreases, and thus strain applied to the semiconductor components of respective layers decreases. As a result, chip cracking can be further prevented.

In the embodiment, the solder-bonding of the terminals 101 and 121, the solder-bonding of the terminals 122 and 141, and the solder-bonding of the terminals 142 and 161 of the sequential stacked body 2C is carried out using the apparatus 5. Here, the sheet material 55 on which the sequential stacked body 2C is provided is disposed to be spaced away from the pair of hot plates 52 and 53. According to this, it is difficult for heat transferred from the hot plates 52 and 53 to be applied to the sequential stacked body 2C. Accordingly, until the sequential stacked body 2C is compressed by the fluid at a predetermined compression force after the sequential stacked body 2C is provided inside the apparatus 5, enlargement of voids in the resin layers 11, 13, and 15 due to softening of the resin layers 11, 13, and 15 of the sequential stacked body 2C is prevented.

In addition, when the temperature of the hot plate 53 is set to be lower than that of the hot plate 52, until the sequential stacked body 2C is compressed by the fluid at a predetermined compression force after the sequential stacked body 2C is provided inside the apparatus 5, enlargement of voids in the resin layers 11, 13, and 15 due to softening of the resin layers 11, 13, and 15 of the stacked body 2 is prevented. On the other hand, when the temperature of the hot plate 52 is set to be higher than that of the hot plate 53, it is possible to raise a temperature of the sequential stacked body 2C to a predetermined temperature in a relatively short time after compressing the sequential stacked body 2C.

In addition, in a case where the sheet material 55 is disposed in the vicinity of the hot plate 52, the temperature of the hot plate 52 may be set to be lower than the temperature of the hot plate 53.

In addition, in this embodiment, in the process of preparing the semiconductor block stacked body 2B, the semiconductor blocks 10B and 12B are bonded to each other through the resin layer 11 in a semi-cured state. Similarly, the semiconductor blocks 12B and 14B are bonded to each other through the resin layer 13 in a semi-cured state, and the semiconductor blocks 14B and 16B are bonded to each other through the resin layer 15 in a semi-cured state. In this manner, since the semiconductor blocks are bonded to each other, the semiconductor chips are prevented from positionally misaligning between the semiconductor blocks.

In addition, when bonding the semiconductor blocks 12B and 14B through the resin layer 13 in a semi-cured state and when bonding the semiconductor blocks 14B and 16B through the resin layer 15 in a semi-cured state, heat is applied to the semiconductor blocks 10B, 12B, and 14B plural times, but this heat is applied to bond the semiconductor blocks to each other by the resin layer in a semi-cured state. Therefore, the heating temperature may be set to be relatively low. In addition, even when the heating temperature is set to be high, a heating time may be relatively short. Accordingly, it is considered that an effect on the semiconductor blocks 10B, 12B, and 14B due to the heat is very small.

Further, in the embodiment, at a preceding stage of constituting the sequential stacked body 2C, the resin layer 11 is provided to the semiconductor block 12B. Similarly, the resin layer 13 is provided to the semiconductor block 14B, and the resin layer 15 is provided to the semiconductor block 16B. All of the semiconductor blocks 12B, 14B, and 16B have a TSV structure, and have a very small thickness. Accordingly, when the each resin layers 11, 13, and 15 are provided, warpage of the semiconductor blocks 12B, 14B, and 16B is prevented from occurring, and thus excellent handability can be achieved.

In addition, in the embodiment, the plurality of individual stacked bodies 2 are solder-bonded to the base material 18, and then encapsulating is carried out. Then, cutting is carried out. According to this, it is possible to improve productivity of the semiconductor device 1.

In addition, the invention is not limited to the above-described embodiments, and modifications and alternations in a range capable of achieving the object of the invention are included in the invention.

In addition, in the above-described embodiments, after forming the resin layer 17 on the base material 18, the individual stacked body 2 is provided over the base material 18, but there is no limitation thereto. For example, the base material 18 and the individual stacked body 2 may be solder-bonded without providing the resin layer 17. Then, encapsulating may be carried out, and an underfill material may be filled between the base material 18 and the individual stacked body 2. In this case, a so-called mold underfill material may be used, and for example, a material, which is disclosed in Japanese Unexamined Patent Application, First Publication No. 2003-12773 and Japanese Unexamined Patent Application, First Publication No. 2003-277585, may be used.

Further, in the above-described respective embodiments, in the individual stacked body 2, after curing the resin layers 11, 13, and 15, the solder-bonding of the base material 18 and the solder-bonding of the individual stacked body 2 is carried out. However, the solder-bonding of the base material 18 and the individual stacked body 2 may be carried out in a state in which the resin layers 11, 13, and 15 are not completely cured.

For example, the resin layers 11, 13, and 15 may be completely cured when carrying out the encapsulating.

In addition, in the above-described respective embodiments, the individual stacked body 2 is solder-bonded one by one to the base material 18 to provide a plurality of the individual stacked bodies 2 on the base material 18, but there is no limitation thereto. For example, after placing the plurality of individual stacked bodies 2 on the base material 18, the plurality of individual stacked bodies 2 may be simultaneously solder-bonded to the base material 18 using the apparatus 5 shown in FIG. 3. More specifically, the same resin layer 17 as the resin layers 11, 13, and 15 is formed on the base material 18. At this time, the resin layer 17 is provided to cover the terminal 181 of the base material 18. Then, the individual stacked body 2 is placed on the resin layer 17, and the base material 18 and the individual stacked body 2 are bonded to each other through the resin layer 17 in a semi-cured state. For example, a flip chip bonder and the like are used, and heating is carried out to bond the base material 18 and the individual stacked body 2. This operation is repeated to bond the plurality of individual stacked bodies 2 to the base material 18. Then, the plurality of individual stacked bodies 2 are simultaneously solder-bonded to the base material 18 by using the apparatus 5 shown in FIG. 3. In this manner, it is possible to increase manufacturing efficiency.

Figure 10:
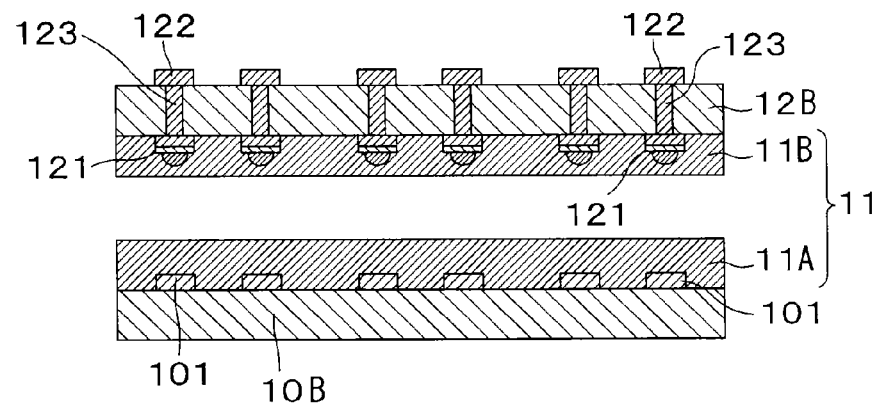
FIG. 10 is a cross-sectional diagram illustrating a process of manufacturing a semiconductor device according to a modification example of the invention.
Figure 11:
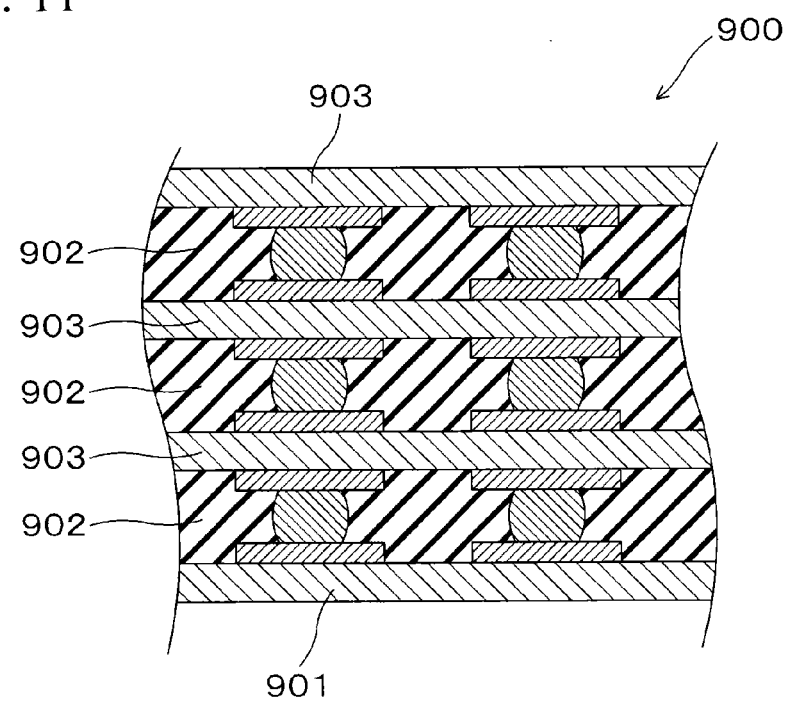
FIG. 11 is a cross-sectional diagram illustrating a structure of a semiconductor device according to the related art.
Figure 12:
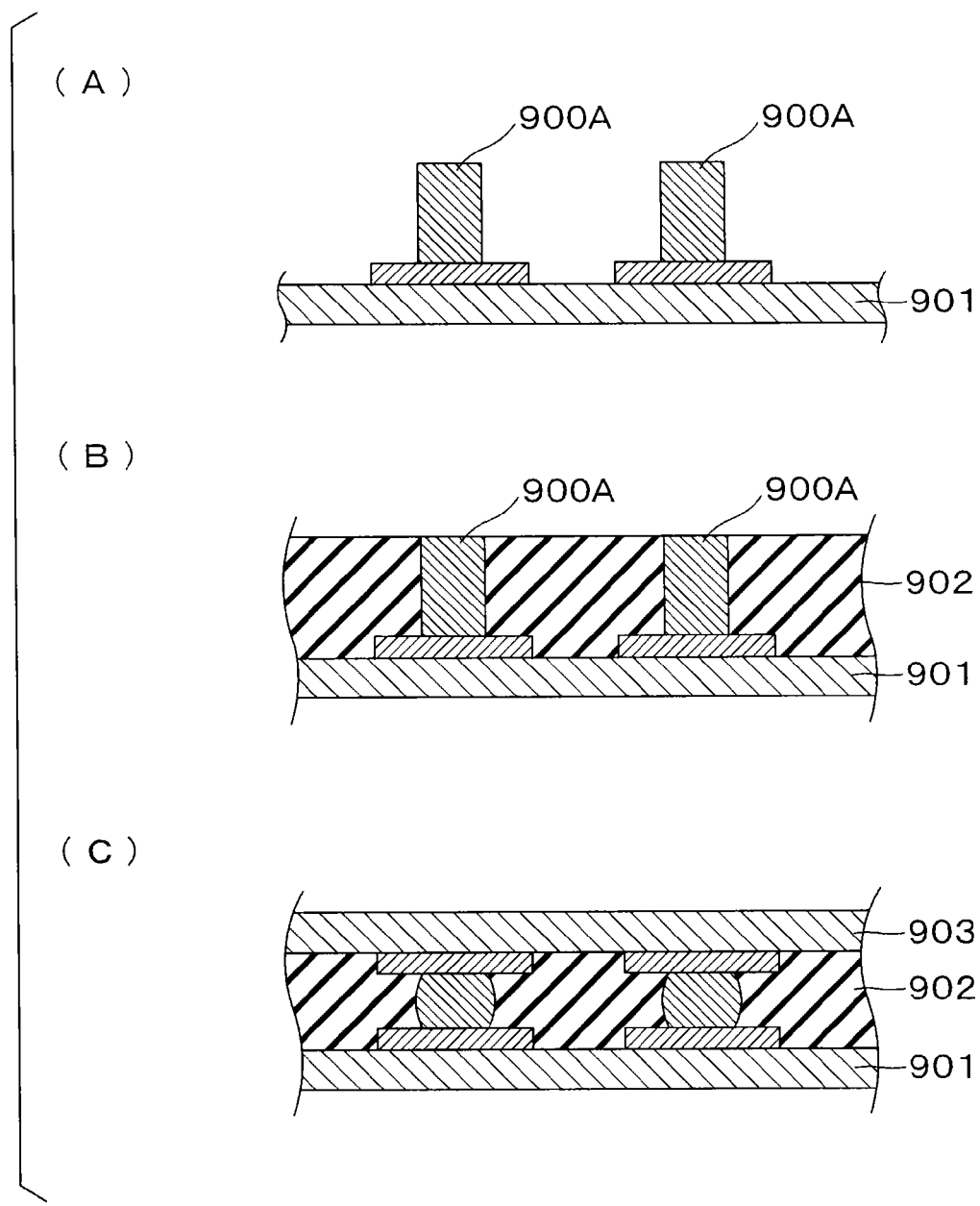
FIG. 12 is a cross-sectional diagram illustrating a process of manufacturing the semiconductor device according to the related art.

Further, in the above-described embodiments, the resin layer 11 is provided on a semiconductor block 12B side, and the semiconductor block 12B to which the resin layer 11 is attached is stacked on the semiconductor block 10B, but there is no limitation thereto. For example, as shown in FIG. 10, resin layers 11A and 11B may be provided to the semiconductor blocks 12B and 10B, respectively, and the resin layer 11 may be constituted by the resin layers 11A and 11B.

In addition, the resin layer 11 may be provided on a semiconductor block 10B side, the resin layer 13 may be provided on a semiconductor block 12B side, and the resin layer 15 may be provided on a semiconductor block 14B side.

Further, in the above-described embodiments, the semiconductor block 10B is configured not to have the TSV structure, but there is no limitation thereto. The semiconductor block 10B may be a semiconductor block having the TSV structure.

In addition, in the above-described embodiments, the semiconductor device 1 including four semiconductor chips is manufactured, but there is no limitation thereto. At least three or more semiconductor chips may be provided. That is, the individual stacked body may be obtained by stacking at least the first semiconductor component, the first resin layer, the second semiconductor component, the second resin layer, and the third semiconductor component, and the plurality of resin layers and the plurality of semiconductor component may be configured to be alternately stacked. In addition, a pair of semiconductor components facing each other through the resin layer may be an individual stacked body which includes connection terminals, which face each other through the resin layer and which electrically connect the semiconductor components, respectively, and in which at least one connection terminal of the above-described connection terminals includes a solder layer.

Further, in the above-described respective embodiments, the terminals 121, 141, 161, and 181 include the solder layer 121A, 141A, 161A, and 181A, respectively, but there is no limitation thereto. The terminals 122, 142, and 162 may include the solder layer on the surface thereof. In addition, all of the terminals 101, 121, 141, 161, and 181, and all of the terminals 122, 142, and 162 may include the solder layer on the surface thereof. The solder-bonding of the semiconductor blocks 10B, 12B, 14B, and 16B, and the solder-bonding of the individual stacked body 2 and the base material 18 may be carried out by melting the solder layer.

Further, in the second embodiment, the semiconductor block 16B to which the resin layer 15 is attached is provided to the press member 43, but there is no limitation thereto. The semiconductor block 16B to which the resin layer 15 is attached may not be provided to the press member 43. For example, the semiconductor block 10B and the semiconductor block 12B are bonded to each other through the resin layer 11 in a semi-cured state, and the semiconductor block 12B and the semiconductor block 14B are bonded through the resin layer 13 in a semi-cured state. Next, a stacked body constituted by the semiconductor block 10B, the resin layer 11, the semiconductor block 12B, the resin layer 13, and the semiconductor block 14B is placed on the press member 44, and then the semiconductor block 16B to which the resin layer 15 is attached is placed on the stacked body to constitute the block stacked body 2B. In the block stacked body 2B, the semiconductor block 16B is in a state of not being bonded to the semiconductor block 14B through the resin layer 15. Then, the block stacked body 2B is compressed by the press member 44 and 43, and is heated to carry out the solder-bonding. The solder-bonding may be carried out using a wafer bonder, a flip chip bonder, and the like.

Further, a first block stacked body, in which the semiconductor block 16B to which the resin layer 15 is attached and the semiconductor block 14B to which the resin layer 13 is attached are bonded to each other, may be configured. A second block stacked body, in which the semiconductor block 12B to which the resin layer 11 is attached and the semiconductor block 10B are bonded to each other, may be configured. The first block stacked body may be provided to the press member 43, and the second block stacked body may be provided to the press member 44.

Example 1

1. Preparation of Resin Film

Resin Layer 9 g of phenol novolak resin (manufactured by SUMITOMO BAKELITE CO., LTD., model number: PR-55617), 26.8 g of liquid bisphenol A type epoxy resin (manufactured by Dainippon Ink and Chemicals, Incorporated, model number: EPICLON-840S), 9 g of phenolphthalein (manufactured by Tokyo Chemical Industry Co., Ltd.), 14.8 g of bisphenol A type phenoxy resin (manufactured by TOHTO Kasei Industry Co, Ltd., model number: YP-50), 0.1 g of 2-phenyl-4-methyl imidazole (manufactured by SHIKOKU CHEMICALS CORPORATION, model number: 2P4MZ), 0.5 g of $\beta$-(3,4-epoxycyclohexyl)ethyltrimethoxysilane (Shin-Etsu Chemical Co., Ltd., model number: KBM-403), and 40 g of spherical silica filler (manufactured by Admatechs, model number: SC1050, average particle size: 0.25 µm) were dissolved in methylethylketone and were stirred to obtain resin varnish in which a concentration of a solid content was 50% by weight.

The resin varnish was applied onto a polyester film (manufactured by TORAY INDUSTRIES, INC., model number: lumirror), and the applied resin varnish was dried under a condition of 100° C./5 min to obtain a resin film having a resin thickness of 26 µm.

A melt viscosity of the resin film at 80° C. was 1,200 Pa·s, and the melt viscosity at 150° C. was 230 Pa·s.

2. Preparation of Resin-Film-Attached Silicon Chip 8-inch silicon wafer A in which a dicing film was formed was prepared. The thickness of the silicon wafer was set to 100 μmt, a pad having φ of 40 μm and a height of 10 μm was formed on the surface side on which the dicing film was formed, and Ni/Au plating was formed on a pad surface.

On the surface which was opposite to the surface on which the dicing film was formed, a copper bump having φ of 40 μm and a height of 8 μm was formed, and a Sn-3.5 Ag solder layer having a thickness of 6 μm was formed on the copper bump. In addition, a through silicon via (TSV) that penetrated through the front and rear surfaces of the silicon waver was formed.

A resin film was stacked on the 8-inch silicon wafer A on the surface side on which the copper bump was formed using a vacuum laminator (manufactured by MEIKI CO., LTD., model number: MVLP-500/600-2A) under a condition of 95° C./30 sec/0.8 MPa. Next, a (dicing film/silicon wafer A/resin film) stacked body was diced using a dicing device (manufactured by DISCO Inc., model number: DFD-6340) under the following conditions to obtain a resin-film-attached silicon chip block A in which the size was 18 mm square and the number of solder bumps was 9,801. In addition, the resin-film-attached silicon chip block A was an assembly of nine resin-film-attached silicon chips a in which the chip size was 6 mm square and the number of solder bumps was 1,089 (bump pitch was 180 μm, area array arrangement).

<Dicing Condition>
Dicing speed: 20 mm/sec
Number of spindle revolutions: 40,000 rpm
Blade article number: ZH05-SD 3500-N-1-50 BB (manufactured by DISCO Inc.)

3. Preparation of Block Stacked Body

A silicon chip block B in which 9,801 pads having φ of 40 μm and a height of 10 μm were formed on one side was prepared. Ni/Au plating was formed on a pad surface of the silicon chip block B. The size and the thickness of the silicon chip block B were 18 mm square and 100 μm, respectively. On the surface of the silicon chip block B, which was opposite to the surface on which the pads were formed, a pad and a bump were not formed. In addition, the silicon chip block B was an assembly of nine silicon chips b in which the size was 6 mm square and the number of pads was 1,089 (pad pitch was 180 μm, area array arrangement).

Stacking of the silicon chip block (semiconductor block) was carried out using a flip chip bonder (manufactured by Panasonic Factory Solutions Co., Ltd., model number: FCB3). A lower side stage of the flip chip bonder was set to 100° C. The silicon chip block B was mounted on the lower side stage. Next, the resin-film-attached silicon chip block A was suctioned on a bonding tool that was set to 150° C. The silicon chip block B and the silicon chip block A were positionally aligned using upper and lower cameras of the flip chip bonder and were stacked under a condition of a load of 45 N/2 sec to obtain a (silicon chip block B/resin film/silicon chip block A) stacked body.

Next, the (silicon chip block B/resin film/silicon chip block A) stacked body that was obtained as described above was mounted on the lower side stage that was set to 100° C., the resin-film-attached silicon chip block A was suctioned on the bonding tool that was set to 150° C., the silicon chip block A and the resin-film-attached silicon chip block A in the stacked body were positionally aligned using the upper and lower cameras of the flip chip bonder and were stacked under a condition of a load of 45 N/2 sec to obtain a (silicon chip block B/resin film/silicon chip block A/resin film/silicon chip block A) stacked body (stacked body (I)).

4. Bonding and Cutting of Block Stacked Body

Bonding between (solder bump/pad) of the each layer of the stacked body (I) was carried out using the flip chip bonder. The lower side stage of the flip chip bonder was set to 100° C., and the stacked body (I) was mounted on the lower side stage. The stacked body (I) was compressed by the bonding tool that was set to 150° C. under a condition of a load of 450 N/12 sec. Then, the temperature of the bonding tool was rapidly raised to set the temperature of the bonding tool to 280° C., and compression was performed under a condition of 450 N/12 sec to carry out the solder-bonding (solder bump/pad) of the each layer so as to obtain a (silicon chip block B/resin film/silicon chip block A/resin film/silicon chip block A) stacked body.

Next, the (silicon chip block B/resin film/silicon chip block A/resin film/silicon chip block A) stacked body was compressed and cured using a compressing and heating device (manufactured by KYOSIN ENGINEERING, model number: HPV-5050MAH-D). As a compression fluid, air was used, and the stacked body was compressed and cured under a condition of 180° C./2 hr/0.8 MPa to obtain a stacked body (stacked body (II)).

Next, the stacked body (II) was diced using the dicing device under the following conditions to obtain a (silicon chip b/resin film/silicon chip a/resin film/silicon chip a) stacked body (stacked body (III)) having a chip size of 6 mm square.

<Dicing Condition>
Dicing speed: 2 mm/sec
Number of spindle revolutions: 30,000 rpm
Blade article number: ZH05-SD 3500-N-1-50 DD 5. Preparation of Substrate A substrate having the following specifications was obtained using an insulating material (SUMITOMO BAKELITE CO., LTD., model number: LαZ4785TH-G, thickness: 240 μm), and a solder resist (manufactured by TAIYO INK MFG. CO., LTD., model number: PFR-800AUS SR-1, thickness: 25 μm).

A copper bump having φ of 40 μm and a height of 8 μm which corresponds to the pad of the stacked body (III) was formed on the substrate on a mounting surface side, and a solder layer of Sn-3.5Ag having a thickness of 18 μm was formed on the bump. The size of the substrate was 10 mm×10 mm×0.3 mmt.

6. Preparation of Liquid Encapsulating Resin Composition A

Next, 100 g of bisphenol F type epoxy resin (manufactured by DIC Co., Ltd., model number: EXA-830 LVP), 30 g of gentisic acid (manufactured by Tokyo Chemical Industry Co., Ltd.), 65 g of spherical silica filler (manufactured by Admatechs, model number: SO-25H, an average particle size: 0.6 μm), 2 g of butadiene-acrylonitrile rubber (manufactured by UBE INDUSTRIES, LTD., model number: CTBN1008SP), and 0.2 g of 2-phenyl-4-methyl imidazole (manufactured by SHIKOKU CHEMICALS CORPORATION, model number: 2P4MZ) were kneaded by a planetary mixer and three rolls to obtain a liquid encapsulating resin composition A for bonding and resin-encapsulating the stacked body (III) and the substrate.

7. Bonding of Stacked Body (III) and Substrate 1.55 g of the liquid encapsulating resin composition A was added dropwise onto a stacked body (III) mounting surface of the substrate by using a dispenser.

The lower side stage of the flip chip bonder was set to 60° C., and the substrate on which the liquid encapsulating resin composition A was applied was mounted on the lower side stage. The stacked body (III) was suctioned to the bonding tool that was set to 200° C., and the stacked body (III) and the substrate were positionally aligned using the upper and lower cameras of the flip chip bonder. The stacked body (III) was compressed under a condition of a load of 15 N/0.5 sec. Then, the temperature of the bonding tool was rapidly raised to set the temperature of the bonding tool to 320° C., and compression was performed under a condition of 15 N/4 sec to carry out the solder-bonding of (solder bump of the substrate/pad of the stacked body (III)) to obtain a substrate on which the stacked body (III) was mounted.

Next, the liquid encapsulating resin composition A was compressed and cured using the compressing and heating device. As a compression fluid, air was used, and the resin composition A was compressed and cured under a condition of 150° C./2 hr/0.8 MPa to obtain a stacked body (IV).

8. Encapsulating

The stacked body (IV) was encapsulating-molded with an epoxy resin encapsulating material (SUMITOMO BAKELITE CO., LTD., model number: sumicon EME-G770) using a transfer molding machine at a mold temperature of 175° C., an injection pressure of 7.8 MPa, and a curing time of 2 minutes, and post-curing was carried out at 175° C. for 2 hours to obtain a semiconductor device.

9. Evaluation of Semiconductor Device

The semiconductor device that was obtained was embedded in an epoxy resin, and a cross-section was observed with a scanning electron microscope (SEM). As a result, the solder-bonding of (silicon chip b/silicon chip a), and the solder-bonding of (silicon chip a/silicon chip a) was satisfactory, and cracking of the silicon chip was not observed. Further, a void was not observed in the resin layer between (silicon chip b/silicon chip a) and between (silicon chip a/silicon chip a).

Example 2

1. Dicing of Block Stacked Body

The stacked body (I) that was obtained in Example 1 was diced using the dicing device under the following conditions to obtain a (silicon chip b/resin film/silicon chip a/resin film/silicon chip a) sequential stacked body (stacked body (X)) having a chip size of 6 mm square.
<Dicing Condition>
Dicing speed: 2 mm/sec
Number of spindle revolutions: 30,000 rpm
Blade article number: ZH05-SD 3500-N-1-50 DD

2. Bonding of Sequential Stacked Body

Bonding of (solder bump/pad) of the each layer of the stacked body (X) was carried out using the flip chip bonder. The lower side stage of the flip chip bonder was set to 100° C., and the stacked body (X) was mounted on the lower side stage. The stacked body (X) was compressed by the bonding tool that was set to 150° C. under a condition of a load of 50 N/12 sec. Then, the temperature of the bonding tool was rapidly raised to set the temperature of the bonding tool to 280° C., and compression was performed under a condition of 50 N/12 sec to carry out the solder-bonding of (solder bump/pad) of the respective layers so as to obtain an individual (silicon chip b/resin film/silicon chip a/resin film/silicon chip a) stacked body.

Next, the (silicon chip b/resin film/silicon chip a/resin film/silicon chip a) stacked body was compressed and cured using the compressing and heating device. As a compression fluid, air was used, and the stacked body was compressed and cured under a condition of 180° C./2 hr/0.8 MPa to obtain a stacked body (stacked body (Y)).

3. Bonding of Stacked Body (Y) and Substrate 1.55 g of the liquid encapsulating resin composition A that was obtained in Example 1 was added dropwise onto a stacked body (Y) mounting surface of the substrate that was obtained in Example 1 by using a dispenser.

The lower side stage of the flip chip bonder was set to 60° C., and the substrate on which the liquid encapsulating resin composition A was applied was mounted on the lower side stage. The stacked body (Y) was suctioned on the bonding tool that was set to 200° C., and the stacked body (Y) and the substrate were positionally aligned using the upper and lower cameras of the flip chip bonder. The stacked body (Y) was compressed under a condition of a load of 15 N/0.5 sec. Then, the temperature of the bonding tool was rapidly raised to set the temperature of the bonding tool to 320° C., and compression was performed under a condition of 15 N/4 sec to carry out the solder-bonding of (solder bump of the substrate/the pad of the stacked body (Y)) so as to obtain a substrate on which the stacked body (Y) was mounted.

Next, the liquid encapsulating resin composition A was compressed and cured using the compressing and heating device. As a compression fluid, air was used, and the resin composition A was compressed and cured under a condition of 150° C./2 hr/0.8 MPa to obtain a stacked body (Z).

4. Encapsulating

The stacked body (Z) was encapsulating-molded with an epoxy resin encapsulating material (SUMITOMO BAKELITE CO., LTD., model number: sumicon EME-G770) using a transfer molding machine at a mold temperature of 175° C., an injection pressure of 7.8 MPa, and a curing time of 2 minutes, and post-curing was carried out at 175° C. for 2 hours to obtain a semiconductor device.

5. Evaluation of Semiconductor Device

The semiconductor device that was obtained was embedded in an epoxy resin, and the cross-section was observed with a scanning electron microscope (SEM). As a result, the solder-bonding of (silicon chip b/silicon chip a), and the solder-bonding of (silicon chip a/silicon chip a) was satisfactory, and cracking of the silicon chip was not observed. Further, a void was not observed in the resin layer between (silicon chip b/silicon chip a) and between (silicon chip a/silicon chip a).

Comparative Example 1

1. Preparation of Resin-Film-Attached Silicon Chip

The (dicing film/silicon wafer/resin film) stacked body that was obtained in Example 1 was diced under the following conditions to obtain a resin-film-attached silicon chip a in which the chip size was 6 mm square and the number of solder bumps was 1,089 (bump pitch was 180 μm, area array arrangement).

<Dicing Condition>
Dicing speed: 20 mm/sec
Number of spindle revolutions: 40,000 rpm
Blade article number: ZH05-SD 3500-N-1-50 BB 2. Bonding of Stacked Body A silicon chip b, in which 1,089 pads having φ of 40 μm and a height of 10 μm (pad pitch was 180 μm, area array arrangement) were formed on one side of the silicon chip, was prepared. Ni/Au plating was formed on a pad surface of the silicon chip b, the chip size was 6 mm square and the chip thickness was 100 μm. In addition, on the surface of the silicon chip b, which was opposite to the surface on which the pads were formed, a pad and a bump were not formed.

The lower side stage of the flip chip bonder was set to 100° C., and the silicon chip b was mounted on the lower side stage. Next, the resin-film-attached silicon chip a was suctioned on the bonding tool that was set to 150° C. The silicon chip b and the resin-film-attached silicon chip a were positionally aligned using the upper and lower cameras of the flip chip bonder and the resultant stacked body were compressed under a condition of a load of 50 N/12 sec. Then, the temperature of the bonding tool was rapidly raised to set the temperature of the bonding tool to 280° C., and compression was performed under a condition of 280° C./50 N/12 sec to carry out the solder-bonding of (solder bump/pad) so as to obtain a (silicon chip b/resin film/silicon chip a) stacked body.

Next, the (silicon chip b/resin film/silicon chip a) stacked body that was obtained as described above was mounted on the lower side stage that was set to 100° C., and the resin-film-attached silicon chip a was suctioned on the bonding tool that was set to 150° C., the silicon chip a and the resin-film-attached silicon chip a of the (silicon chip b/resin film/silicon chip a) stacked body were positionally aligned using the upper and lower cameras of the flip chip bonder, and the stacked body was compressed under a condition of a load of 50 N/12 sec. Then, the temperature of the bonding tool was rapidly raised to set the temperature of the bonding tool to 280° C., and compression was performed under a condition of 280° C./50 N/12 sec to carry out the solder-bonding of (solder bump/pad) so as to obtain a (silicon chip b/resin film/silicon chip a/resin film/silicon chip a) stacked body.

Next, the (silicon chip b/resin film/silicon chip a/resin film/silicon chip a) stacked body was compressed and cured using the compressing and heating device. As a compression fluid, air was used, and the stacked body was compressed and cured under a condition of 180° C./2 hr/0.8 MPa to obtain a compressed and cured (silicon chip b/resin film/silicon chip a/resin film/silicon chip a) stacked body.

In Comparative Example 1, it was necessary to cool down the bonding tool from 280° C. to 150° C. at a preceding stage of the second solder-bonding process, but the cooling time was 30 s. However, in Examples, it was not necessary to cool down the bonding tool, and it was confirmed that productivity was raised. Further, in Example 1, since the stacking and bonding were carried out for each silicon chip block, it was confirmed that productivity was further raised. In addition, in Comparative Example 1, positional misalignment between (solder bump/pad), which was considered to be because the solder between (silicon chip b/silicon chip a) was remelted during the second solder-bonding process, was observed. However, the positional misalignment was not observed in Examples.

Comparative Example 2

1. Preparation of Liquid Sealing Resin Composition B 15.955% by weight of bisphenol F type epoxy resin and 15.955% by weight of glycidylamine type epoxy resin as a liquid epoxy resin (A), 16.383% by weight of aromatic first grade amine type curing agent as a curing agent (B), 50.000% by weight of spherical silica having an average particle size of 0.5 μm and the maximum particle size of 24 μm as an inorganic filling agent (C), 0.016% by weight of liquid silicone compound (D) having an amino group, 1.596% by weight of epoxy silane coupling agent as a silane coupling agent, and 0.095% by weight of coloring agent were blended, and were mixed using a planetary mixer and three rolls. The resultant mixture was subjected to a vacuum degassing treatment to obtain a liquid encapsulating resin composition B.

2. Preparation of Silicon Chip

An 8-inch silicon wafer A in which a dicing film was formed was diced to obtain a silicon chip a having a chip size of 6 mm square. In addition, an 8-inch silicon wafer B in which a dicing film was formed was diced to obtain a silicon chip b having a chip size of 6 mm square.

3. Bonding of Stacked Body

A flux was applied onto a pad-forming surface of the silicon chip b, and the silicon chip b was mounted on the lower side stage of the flip chip bonder. The silicon chip a was suctioned on the bonding tool and the silicon chip b and the silicon chip a were positionally aligned using the upper and lower cameras of the flip chip bonder. The silicon chip a and the silicon chip b are stacked in such a manner that a bump forming surface of the silicon chip a and the pad-forming surface of the silicon chip b were made to face each other, thereby obtaining a temporary stacked body. The temporary stacked body was heated in a reflow furnace to a temperature equal to or higher than the melting point of the solder so as to carry out the solder-bonding. Further, flux removal washing was carried out to obtain a (silicon chip b/silicon chip b) stacked body.

A flux was applied onto the pad-forming surface of the silicon chip a of the (silicon chip b/silicon chip a) stacked body that was obtained, and the stacked body was mounted on the lower side stage of the flip chip bonder. The other silicon chip a was suctioned on the bonding tool, and the silicon chip a in the (silicon chip b/silicon chip a) stacked body and the other silicon chip a were positionally aligned using the upper and lower cameras of the flip chip bonder, thereby obtaining a temporary stacked body in which the bump forming surface of the other silicon chip a and the pad-forming surface of the silicon chip a of the (silicon chip b/silicon chip a) stacked body were made to face each other. The temporary stacked body was heated in the reflow furnace to a temperature equal to or higher than the inciting point of a solder to carry out the solder-bonding, and the flux removal washing was carried out to obtain a (silicon chip b/silicon chip a/silicon chip a) stacked body.

4. Encapsulating Between Silicon Chips

The above-described stacked body was heated on a hot plate maintained at 110° C., the liquid encapsulating resin composition B was dispensed onto one side of the (silicon chip b/silicon chip a/silicon chip a) stacked body to fill a space between (silicon chip b/silicon chip a) and a space between (silicon chip a/silicon chip a), and the liquid encapsulating resin composition B was heated and cured in an oven maintained at 150° C. for 120 minutes.

5. Evaluation of Stacked Body

The obtained stacked body in which each of the spaces between silicon chips was encapsulated was embedded in an epoxy resin, and a cross-section was observed with a scanning electron microscope (SEM). As a result, a plurality of voids were observed between (silicon chip b/silicon chip a) and between (silicon chip a/silicon chip a).

As is clear from the above-described results, in the semiconductor device that was obtained by the method of manufacturing a semiconductor device according to the invention, since the heat treatment at a temperature equal to or higher than the melting point of the solder was carried out once and the solder-bonding of the corresponding semiconductor components was simultaneously carry out, productivity was excellent. In addition, cracking was not observed in the semiconductor component of the individual stacked body that was obtained, and reliability was excellent. On the contrary, in Comparative Example 1, it was necessary to carry out the heat treatment two times at a temperature equal to or higher than the melting point of the solder so as to solder-bond three semiconductor components, and thus productivity deteriorated. In addition, in Comparative Example 2, since the resin encapsulating was carried out after bonding the semiconductor components to each other, a plurality of voids were observed between the semiconductor components.

INDUSTRIAL APPLICABILITY

According to the invention, a method of manufacturing a semiconductor device, a block stacked body, and a sequential stacked body, which are capable of improving productivity and reliability, are provided. Accordingly, the invention can be suitably used for manufacturing a semiconductor device having high reliability.

REFERENCE SIGNS LIST

1: Semiconductor device
2: Individual stacked body
2B: Block stacked body
2C: Sequential stacked body
3: Structure body
5: Apparatus
6: Apparatus
10: Semiconductor chip
10B: Semiconductor block
11: Resin layer
11A, 11B: Resin layer
12: Semiconductor chip
12B: Semiconductor block
13: Resin layer
14: Semiconductor chip
14B: Semiconductor block
15: Resin layer
16: Semiconductor chip
16B: Semiconductor block
17: Resin layer
18: Base material
18A: Base material
19: Encapsulating material
41, 42: Press member
43: Press member
44: Press member
51: Container
52: Hot plate
53: Hot plate
54: Pin
55: Plate material
101: Terminal
120: Substrate
121: Terminal
121A: Solder layer
122: Terminal
123: Via
140: Substrate
141: Terminal
141A: Solder layer
142: Terminal
143: Via
160: Substrate
161: Terminal
161A: Solder layer
162: Terminal
163: Via
181: Terminal
181A: Solder layer
511: Pipe
900A: Connection bump
900: Semiconductor device
901: Interposer
902: Film-shaped adhesive
903: Semiconductor chip

The invention claimed is:

1. A method of manufacturing a semiconductor device, the method comprising:
a process of preparing a first semiconductor block in which a plurality of first semiconductor components are arranged and which includes a second semiconductor component connection terminal, a first resin layer, a second semiconductor block in which a plurality of second semiconductor components are arranged and which includes a first semiconductor component connection terminal on one surface side and a third semiconductor component connection terminal on the other surface side, a second resin layer, and a third semiconductor block in which a plurality of third semiconductor components are arranged and which includes a second semiconductor component connection terminal;
a sequential stacking process of sequentially stacking the first semiconductor block, the first resin layer, the second semiconductor block, the second resin layer, and the third semiconductor block, and bonding the layers to obtain a block stacked body; and
a process of obtaining an individual stacked body, in which the second semiconductor component connection terminal of the first semiconductor component and the first semiconductor component connection terminal of the second semiconductor component are solder-bonded to each other and the third semiconductor component connection terminal of the second semiconductor component and the second semiconductor component connection terminal of the third semiconductor component are solder-bonded, and which is cut in a stacked semiconductor component unit, from the block stacked body.

2. The method of manufacturing a semiconductor device according to claim 1,
wherein the block stacked body is obtained by the sequential stacking process including,
a process of stacking the first resin layer and the second semiconductor block on the first semiconductor block in this order, and heating the resultant stacked body to bond the first semiconductor block and the second semiconductor block through the first resin layer in a semi-cured state, and
a process of stacking the second resin layer and the third semiconductor block on the second semiconductor block in this order, and heating the resultant stacked body to bond the second semiconductor block and the third semiconductor block through the second resin layer in a semi-cured state.

3. The method of manufacturing a semiconductor device according to claim 1, further comprising:
a process of providing the individual stacked body, which is solder-bonded, on a base material; and
a base material bonding process of bonding the individual stacked body and the base material.

4. The method of manufacturing a semiconductor device according to claim 1,
wherein at a preceding stage of the sequential stacking process,
a resin layer that constitutes the first resin layer is provided on at least any one of the surface of the second semiconductor block on which the first semiconductor component connection terminal is formed and the surface of the first semiconductor block on which the second semiconductor component connection terminal is formed, and
a resin layer that constitutes the second resin layer is provided on at least any one of the surface of the third semiconductor block on which the second semiconductor component connection terminal is formed and the surface of the second semiconductor block on which the third semiconductor component connection terminal is formed.

5. The method of manufacturing a semiconductor device according to claim 1,
wherein the block stacked body is configured in such a manner that at least any one of the second semiconductor component connection terminal of the first semiconductor component and the first semiconductor component connection terminal of the second semiconductor component includes a solder layer, and at least any one of the third semiconductor component connection terminal of the second semiconductor component and the second semiconductor component connection terminal of the third semiconductor component includes a solder layer, and
the process of obtaining the individual stacked body includes,
a block stacked body bonding process of heating the block stacked body to a temperature equal to or higher than a melting point of the solder layer to solder-bond the second semiconductor component connection terminal of the first semiconductor component and the first semiconductor component connection terminal of the second semiconductor component, and the third semiconductor component connection terminal of the second semiconductor component and the second semiconductor component connection terminal of the third semiconductor component, respectively, and a cutting process of cutting the block stacked body in a stacked semiconductor component unit after the block stacked body bonding process to obtain the individual stacked body.

6. The method of manufacturing a semiconductor device according to claim 5,
wherein the first resin layer and the second resin layer each contain a thermosetting resin, and
in the block stacked body bonding process, the block stacked body, in which the first semiconductor block and the second semiconductor block are bonded to each other through the first resin layer and the second semiconductor block and the third semiconductor block are bonded to each other through the second resin layer, is heated to carry out solder-bonding and promote curing of the first resin layer and the second resin layer.

7. The method of manufacturing a semiconductor device according to claim 5,
wherein in the block stacked body bonding process, the block stacked body is provided on the upper side of one press member of a pair of press members, and the block stacked body is compressed between the one press member and the other press member and is heated to carry out solder-bonding and to promote curing of the first resin layer and the second resin layer.

8. The method of manufacturing a semiconductor device according to claim 5,
wherein in the block stacked body bonding process, the block stacked body is heated while being compressed with a fluid to carry out solder-bonding.

9. The method of manufacturing a semiconductor device according to claim 7,
wherein an apparatus, which includes the pair of press members disposed to face each other, and a setting portion which is disposed between the pair of press members and on which the block stacked body is provided, is prepared, and
the block stacked body bonding process includes,
a process of heating the pair of press members and disposing the block stacked body on the setting portion that is spaced away from the pair of press members, and
a process of compressing and heating the block stacked body and the setting portion with the pair of press members to carry out solder-bonding.

10. The method of manufacturing a semiconductor device according to claim 7,
wherein a temperature of the one press member is lower than a temperature of the other press member.

11. The method of manufacturing a semiconductor device according to claim 5,
wherein the first resin layer and the second resin layer each contain a thermosetting resin, and
between the block stacked body bonding process and the base material bonding process, the block stacked body is heated while being compressed with a fluid to promote curing of the first resin layer and the second resin layer.

12. The method of manufacturing a semiconductor device according to claim 1,
wherein the block stacked body is configured in such a manner that at least any one of the second semiconductor component connection terminal of the first semiconductor component and the first semiconductor component connection terminal of the second semiconductor component includes a solder layer, and at least any one of the third semiconductor component connection terminal of the second semiconductor component and the second semiconductor component connection terminal of the third semiconductor component includes a solder layer, and the process of obtaining the individual stacked body includes, a cutting process of cutting the block stacked body in a stacked semiconductor component unit to obtain a sequential stacked body, and a sequential stacked body bonding process of heating the sequential stacked body to a temperature equal to or higher than a melting point of the solder layer, and solder-bonding the second semiconductor component connection terminal of the first semiconductor component and the first semiconductor component connection terminal of the second semiconductor component and solder-bonding the third semiconductor component connection terminal of the second semiconductor component and the second semiconductor component connection terminal of the third semiconductor component, respectively, to obtain an individual stacked body.

13. The method of manufacturing a semiconductor device according to claim 12, wherein the first resin layer and the second resin layer each contain a thermosetting resin, and in the sequential stacked body bonding process, the sequential stacked body, in which the first semiconductor component and the second semiconductor component are bonded to each other through the first resin layer, and the second semiconductor component and the third semiconductor component are bonded to each other through the second resin layer, is heated to carry out solder-bonding and promote curing of the first resin layer and the second resin layer.

14. The method of manufacturing a semiconductor device according to claim 12, wherein in the sequential bonding process, the sequential stacked body is disposed on the upper side of one press member of a pair of press members, and the sequential stacked body is compressed between the one press member and the other press member and is heated to carry out solder-bonding and to promote curing of the first resin layer and the second resin layer.

15. The method of manufacturing a semiconductor device according to claim 12, wherein in the sequential stacked body bonding process, the sequential stacked body is heated while being compressed with a fluid to carry out solder-bonding.

16. The method of manufacturing a semiconductor device according to claim 14, wherein an apparatus, which includes the pair of press members disposed to face each other, and a setting portion which is disposed between the pair of press members and on which the sequential stacked body is provided, is prepared, and the sequential stacked body bonding process includes, a process of heating the pair of press members and disposing the sequential stacked body on the setting portion that is spaced away from the pair of press members, and a process of compressing and heating the sequential stacked body and the setting portion with the pair of press members to carry out solder-bonding.

17. The method of manufacturing a semiconductor device according to claim 14, wherein a temperature of the one press member is lower than a temperature of the other press member.

18. The method of manufacturing a semiconductor device according to claim 12, wherein the first resin layer and the second resin layer each contain a thermosetting resin, and between the sequential stacked body bonding process and the base material bonding process, the sequential stacked body is heated while being compressed with a fluid to allow curing of the first resin layer and the second resin layer to proceed.

19. The method of manufacturing a semiconductor device according to claim 3, wherein the individual stacked body has a structure which includes at least the first semiconductor component, the first resin layer, the second semiconductor component, the second resin layer, and the third semiconductor component, in which each of the resin layers and each of the semiconductor components are alternately stacked, and in which the outermost layer is constituted by the semiconductor component, the semiconductor component of the outermost layer includes a base material connection terminal that is connected to the base material, the base material includes a stacked body connection terminal that is connected to the semiconductor component of the outermost layer, and at least any one of the base material connection terminal and the stacked body connection terminal includes a solder layer, and in the base material bonding process, the base material connection terminal and the stacked body connection terminal are solder-bonded.

20. The method of manufacturing a semiconductor device according to claim 3, wherein in the base material bonding process, a plurality of the individual stacked bodies are solder-bonded to the base material, and the base material is cut for each of the individual stacked bodies at a subsequent stage of the base material bonding process.

21. The method of manufacturing a semiconductor device according to claim 1, wherein the second semiconductor component is a semiconductor chip with a TSV structure including a substrate and a through-via which penetrates through the substrate and is connected to the first semiconductor component connection terminal and the third semiconductor component connection terminal, and the third semiconductor component is a semiconductor chip with a TSV structure which includes a substrate and a through-via that penetrates through the substrate, the through-via being connected to the second semiconductor component connection terminal and a terminal provided on the surface side of the substrate, which is opposite to the surface on which the second semiconductor component connection terminal is provided.

22. A block stacked body comprising:

a first semiconductor block in which a plurality of first semiconductor components are arranged and which includes a second semiconductor component connection terminal;

a first resin layer;

a second semiconductor block in which a plurality of second semiconductor components are arranged and which includes a first semiconductor component connection terminal on one surface side and a third semiconductor component connection terminal on the other surface side;

a second resin layer; and a third semiconductor block in which a plurality of third semiconductor components are arranged and which includes a second semiconductor component connection terminal, wherein at least any one of the second semiconductor component connection terminal of the first semiconductor component and the first semiconductor component connection terminal of the second semiconductor component includes a solder layer, and at least any one of the third semiconductor component connection terminal of the second semiconductor component and the second semiconductor component connection terminal of the third semiconductor component includes a solder layer, and the second semiconductor component connection terminal of the first semiconductor component and the first semiconductor component connection terminal of the second semiconductor component are solder-bonded to each other, and the third semiconductor component connection terminal of the second semiconductor component and the second semiconductor component connection terminal of the third semiconductor component are solder-bonded to each other.

23. A sequential stacked body comprising:

a first semiconductor component including a second semiconductor component connection terminal;

a first resin layer;

a second semiconductor component including a first semiconductor component connection terminal on one surface side and a third semiconductor component connection terminal on the other surface side;

a second resin layer; and a third semiconductor component including a second semiconductor component connection terminal, wherein at least any one of the second semiconductor component connection terminal of the first semiconductor component and the first semiconductor component connection terminal of the second semiconductor component includes a solder layer, and at least any one of the third semiconductor component connection terminal of the second semiconductor component and the second semiconductor component connection terminal of the third semiconductor component includes a solder layer, and the second semiconductor component connection terminal of the first semiconductor component and the first semiconductor component connection terminal of the second semiconductor component are not yet solder-bonded, and the third semiconductor component connection terminal of the second semiconductor component and the second semiconductor component connection terminal of the third semiconductor component are not yet solder-bonded.

* * * * *